United States Patent [19]
Mori et al.

[11] Patent Number: 5,594,549
[45] Date of Patent: Jan. 14, 1997

[54] POSITION DETECTING METHOD AND PROJECTION EXPOSURE APPARATUS USING THE SAME

[75] Inventors: Tetsuya Mori, Yokohama; Eiichi Murakami, Kawasaki; Hirohiko Shinonaga, Yokohama, all of Japan

[73] Assignee: Canon Kabushiki Kaisha, Tokyo, Japan

[21] Appl. No.: 70,904

[22] Filed: Jun. 4, 1993

[30] Foreign Application Priority Data

Jun. 4, 1992 [JP] Japan .................................. 4-171722

[51] Int. Cl.⁶ .......................... G01N 21/86; H01L 21/027
[52] U.S. Cl. ................................... 356/401; 250/548
[58] Field of Search ........................... 356/401; 250/548

[56] References Cited

U.S. PATENT DOCUMENTS

| | | | |
|---|---|---|---|
| 4,795,911 | 1/1989 | Kohno et al. | 250/572 |
| 4,886,975 | 12/1989 | Murakami et al. | 250/572 |
| 5,017,798 | 5/1991 | Murakami et al. | 250/572 |
| 5,120,974 | 5/1992 | Muraki | 250/548 |

FOREIGN PATENT DOCUMENTS

| | | |
|---|---|---|
| 0393775 | 10/1990 | European Pat. Off. . |
| 62-232504 | 10/1987 | Japan . |
| 03282715 | 12/1991 | Japan . |

OTHER PUBLICATIONS

Patent Abstracts of Japan, Kokai No. 61-065251, vol. 10, No. 232, Aug. 1986.
Patent Abstracts of Japan, Kokai No. 03-282715, vol. 16, No. 109, Mar. 1992.

*Primary Examiner*—Wael Fahmy
*Assistant Examiner*—David B. Hardy
*Attorney, Agent, or Firm*—Fitzpatrick, Cella, Harper & Scinto

[57] ABSTRACT

A position detecting method includes illuminating a grating mark of an object with monochromatic light; forming an interference image on an image pickup device by using ± n-th order light (n=1, 2, 3 . . . ) among reflective diffraction light from the grating mark; integrating an image signal produced by the image pickup device within a two-dimensional window of a predetermined size set with respect to the image signal and along one direction in two-dimensional coordinates, whereby a one-dimensional projection integration signal is produced; transforming, through rectangular transformation, the one-dimensional projection integration signal into a spatial frequency region; selecting, on the spatial frequency region and from the one-dimensional projection integration signal, a spatial frequency component which appears in the interference image due to the periodicity of the grating mark; and detecting the position of the grating mark on the basis of the selection.

8 Claims, 15 Drawing Sheets

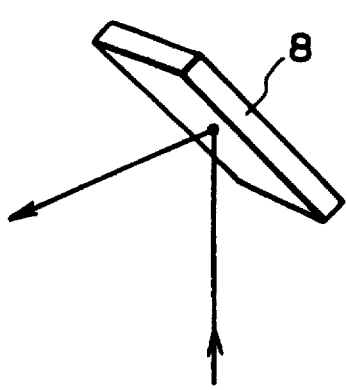
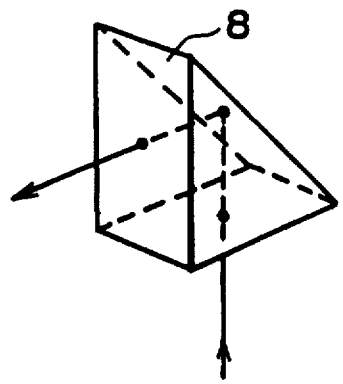
F I G. 9A  F I G. 9B
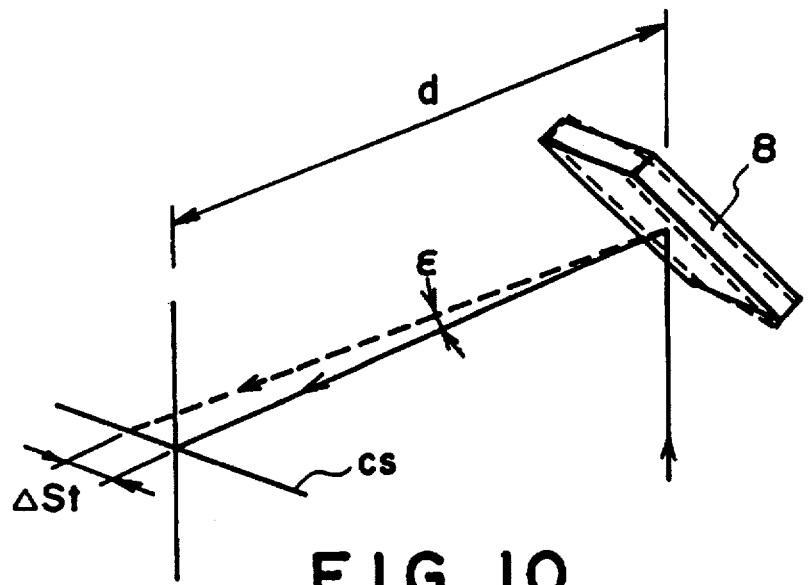
F I G. 10
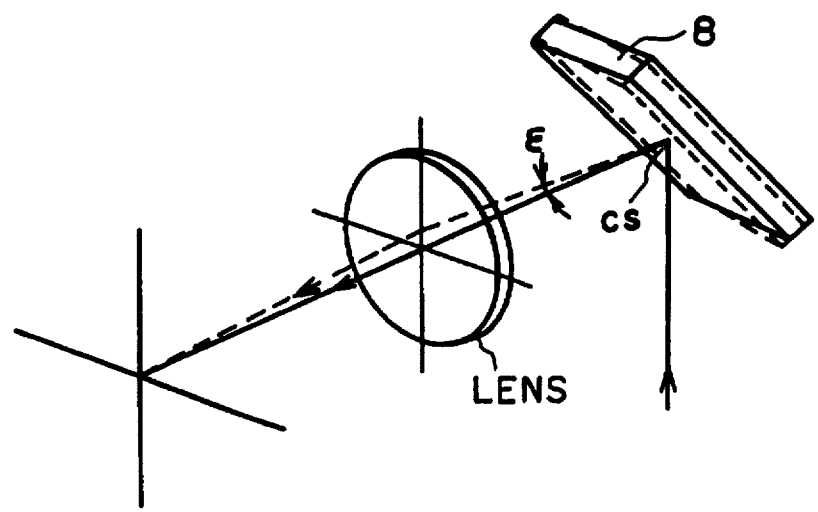
F I G. 11

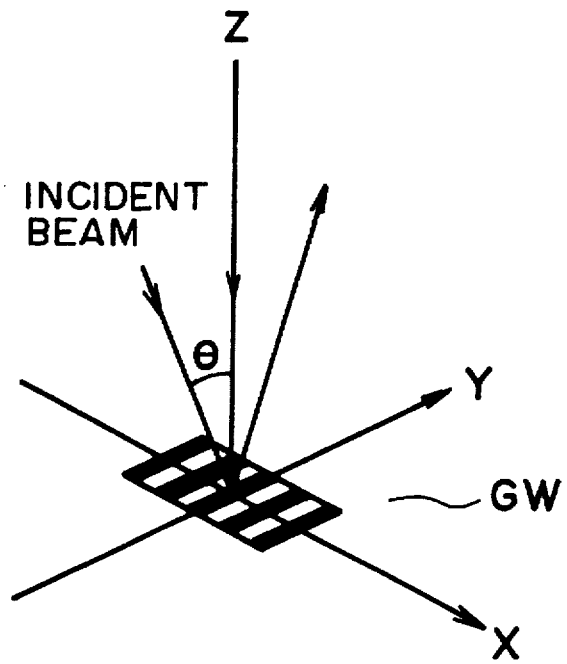
F I G. 17
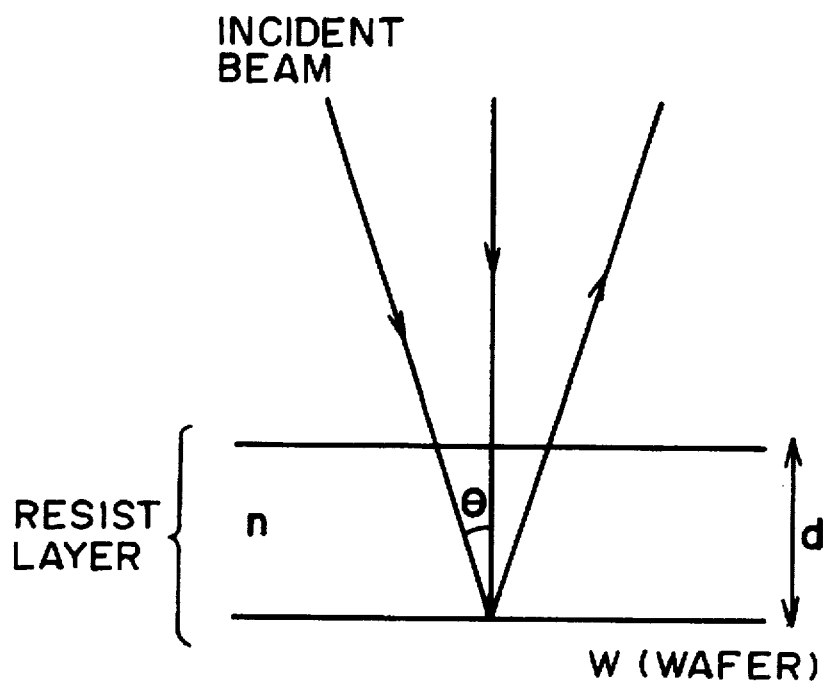
F I G. 18

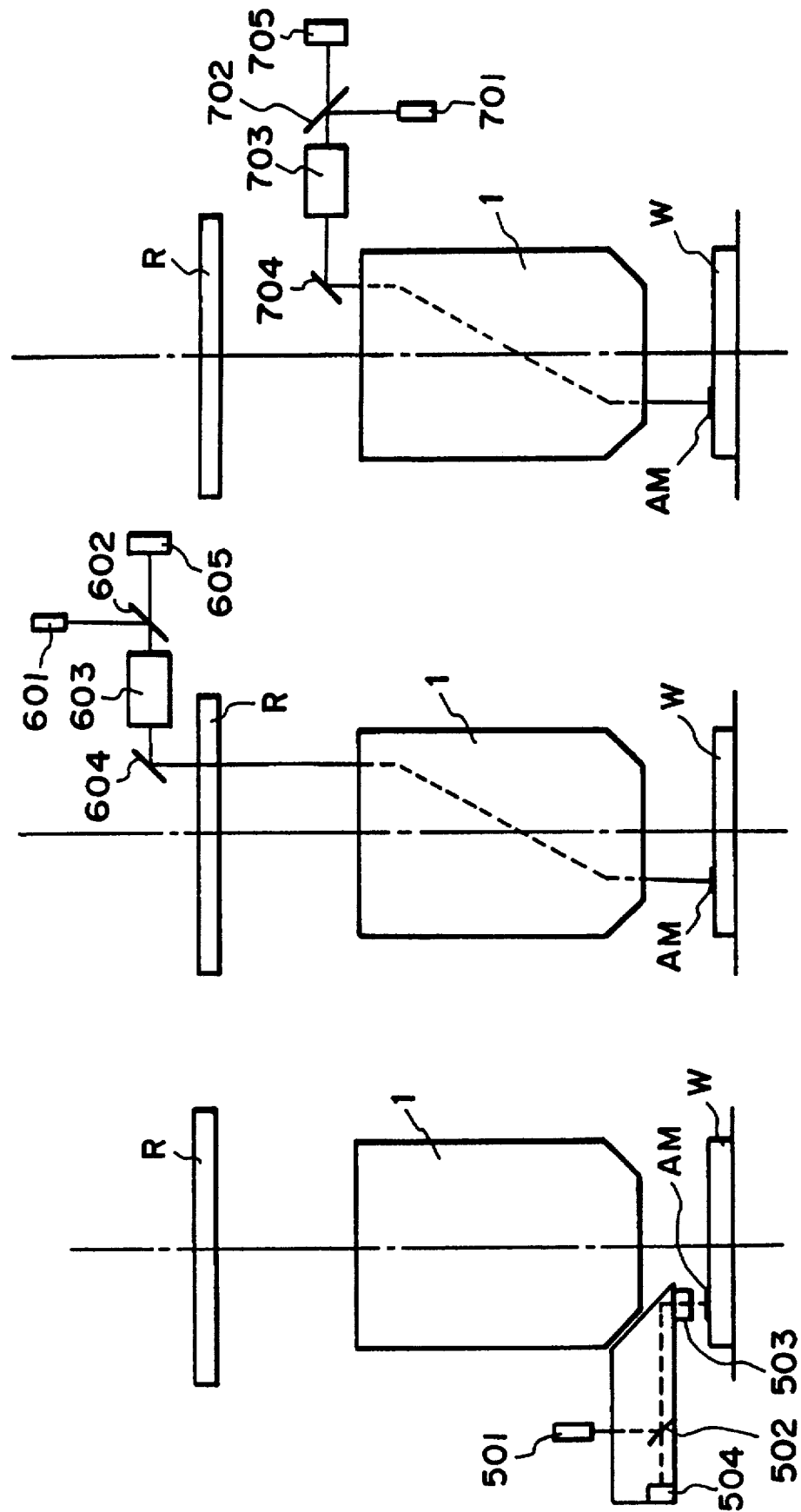

POSITION DETECTING METHOD AND PROJECTION EXPOSURE APPARATUS USING THE SAME

FIELD OF THE INVENTION AND RELATED ART

This invention relates to a position detecting method and a projection exposure apparatus using the same which are particularly suitably usable for manufacture of semiconductor devices.

Semiconductor device manufacturing technology has advanced largely and fine processing techniques have also progressed considerably. Particularly, the optical processing technique has realized fine processing of a resolution of submicron order, with the manufacture of a semiconductor device of 1 mega DRAM. In many cases, for attaining higher resolution, an optical system of a larger numerical aperture (NA) is used while maintaining the exposure wavelength. Recently, however, various attempts have been made to improve the resolution: using an exposure method wherein a super-high pressure Hg lamp is adopted to change the exposure wavelength from g-line to i-line.

Generally, it is known that the depth of focus of a projection optical system (stepper) is inversely proportional to the square of NA. Thus, attaining higher resolution of submicron order necessarily results in a problem of smaller depth of focus.

On the other hand, many proposals have been made to use light of shorter wavelength, typically from an excimer laser, to thereby enhance the resolution. It is known that the effect of using a shorter wavelength of light is inversely proportional to the wavelength used. Thus, the shorter the wavelength, the deeper the depth of focus.

On the other hand, with regard to relative positioning (alignment) of a wafer and a reticle in a projection exposure apparatus, an alignment mark formed on the wafer is imaged on the surface of an image pickup means through or without intervention of a projection lens, and positional information on the wafer is produced through observation of the imaged alignment mark on the image pickup surface.

For observation of the wafer alignment mark in production of wafer positional information, there are three ways such as follows:

(A) Non-exposure light of a wavelength different from the exposure light is used, without intervention of a projection lens ("off-axis type");

(B) Light of the same wavelength as the exposure light is used, which light is projected through a projection lens ("exposure light TTL type"); and (C) Non-exposure light of a wavelength different from the exposure light is used, which light is projected through a projection lens ("non-exposure light TTL type").

FIG. 19 is a schematic view of a main portion of an off-axis type optical system (type A). Non-exposure light from a light source 501 goes via a half mirror 502 and a detection lens system 503, and it illuminates an alignment mark AM on a wafer W. Then, the alignment mark AM is imaged on an image pickup means 504 through the detection lens system 503 and the half mirror 502.

FIG. 20 is a schematic view of a main portion of an exposure light TTL type optical system (type B). Light from a light source 601 having the same wavelength as the exposure light goes via a half mirror 602, a detection lens system 603, a mirror 604 and a projection lens 1, in this order, and it illuminates an alignment mark AM on a wafer W. Then, the alignment mark AM is imaged on an image pickup means 605 through the projection lens 1, the mirror 604 and the detection lens system 603 in this order.

FIG. 21 is a schematic view of a main portion of a non-exposure light TTL type optical system (type C). Non-exposure light from a light source 701 goes via a half mirror 702, a correction lens system 703 (a lens system for correcting aberration resulting from a difference from the wavelength of the exposure light), a mirror 704 and a projection lens 1, and it illuminates an alignment mark AM on a wafer W. Then, the alignment mark AM is imaged on an image pickup means 705 through the projection lens 1, the mirror 704, the correction lens system 703 and the half mirror 702.

In the three methods shown in FIGS. 19–21, the position of the alignment mark AM imaged on the image pickup means is detected and, on the basis of this, the positional information about the wafer W is produced.

As a means for detecting the position of an alignment mark, from image signals obtainable in accordance with any of the three observation methods described above, there are a pattern matching detection method (Japanese Laid-Open Patent Application, Laid-Open No. 232504/1987) and an FFT phase detection method (Japanese Laid-Open Patent Application, Laid-Open No. 282715/1991).

SUMMARY OF THE INVENTION

Miniaturization of a semiconductor device and necessitated increase in the degree of integration of the semiconductor device have forced the use of a shorter wavelength of exposure light in a projection exposure apparatus. Thus, a conventionally used exposure wavelength of g-line (436 nm) from a high pressure Hg lamp has been gradually replaced by exposure light of i-line (365 nm) or an excimer laser (e.g. a KrF excimer laser (248 nm)). With the shortening of exposure wavelength, there arises a large problem: how an alignment system should be structured. This owes to the fact that generally a projection lens is aberration corrected only with respect to the exposure wavelength.

In the off-axis system (type A), the alignment light is not projected through a projection lens, and the system does not depend on the exposure wavelength of the projection lens. Thus, design of an observation optical system is relatively easy.

In the off-axis system, however, due to geometrical limitation to the observation optical system and the projection lens, usually the alignment station and the exposure station are largely separate from each other. This necessitates moving an X-Y stage to the exposure station after completion of the alignment operation.

While there may be no problem if the distance between the alignment station and the exposure station (hereinafter "base line") is unchanged, actually it changes with time due to the effect of ambient conditions (temperature, pressure or mechanical stability resulting from vibration).

In consideration of this, generally in the off-axis system the base line is measured and corrected, at regular intervals. Thus, the off-axis system involves an error factor of "changeability of base line with time", and there is a disadvantage of a time-consuming measurement and correction process, causing reduced throughput.

Further, since in the off-axis system the light is not projected through the projection lens, there is an additional disadvantage that the system does not follow a change of the projection lens (e.g. a change in magnification or focal point position due to the exposure operation, or a change in magnification of focal point position due to a change in pressure).

On the other hand, a TTL system in which the alignment light is projected through a projection lens has an advantage because it follows a change of the projection lens. Also, there is no problem of base line. Even if it occurs, it is very small as compared with the case of the off-axis system, and advantageously the system is less sensitive to changes in environmental conditions.

However, a projection lens is so aberration corrected that the projection exposure is optimized with respect to the exposure wavelength. Thus, if alignment light of a wavelength different from the exposure wavelength is used, the projection lens produces large aberration.

In the exposure light TTL system (type B), exposure wavelength is used as alignment light. Thus, the aberration of a projection lens is corrected satisfactorily, and a good observation optical system is provided.

In many cases, however, the surface of a wafer is coated with a photosensitive material (resist) to which an electronic circuit pattern is to be transferred. When an alignment formed on the wafer is observed, generally the resist shows higher absorbency to shorter wavelengths. As a result, the shortening of exposure wavelength described hereinbefore creates a difficulty in detecting a wafer alignment mark through a resist film, with the exposure wavelength.

Further, there is an additional disadvantage: if an alignment mark is observed with exposure light, the resist is sensitized by the exposure light which makes the alignment mark detection unstable or not possible.

In the non-exposure light TTL system (type C), light of a wavelength different from the exposure wavelength is used as the alignment light. Thus, large aberration is produced by a projection lens. In consideration of this, in the non-exposure light TTL system, an alignment mark is detected through a correction optical system which is provided to correct the aberration produced by the projection lens.

When an excimer laser (e.g. a KrF laser (248 nm)) is to be used as the exposure light, practical glass materials for the projection lens are limited to silica or fluorite, in the point of transmissivity or the like. As a result, the projection lens produces large aberration to the non-exposure light. This makes it difficult to correct the projection lens aberration satisfactorily with a correction optical system. Thus, the NA cannot be made large enough or a practical correction system cannot be structured.

On the other hand, in the pattern matching detection method which is one means for detecting the position of an alignment mark from image information obtained in accordance with any of the above-described observation methods, due to analog-to-digital conversion for processing the electric signal produced by the image pickup means the resultant signal is discrete and the detected alignment mark position is also discrete.

This necessitates using some complementing means to attain the desired precision, and approximation in the complementation creates a detection error. Further, there is a possibility that the image of an alignment mark is distorted due to a noise component such as non-uniformness of resist coating or non-uniform illumination. This degrades the signal-to-noise ratio (S/N ratio), resulting in reduced detection precision.

The FFT phase detection method as disclosed in Japanese Laid-Open Patent Application, Laid-Open No. 282715/1991 is able to solve these problems.

However, as regards the bright-field detected image of an alignment mark of a wafer (hereinafter "wafer mark"), in a structure wherein a wafer mark having a sectional shape as shown in FIG. 22C is covered by a resist, depending on process conditions such as reflectivity of a substrate, interference condition, etc. there may be a case wherein a wafer mark image such as shown in FIG. 22A is detected by a CCD or a case wherein a wafer mark image such as shown in FIG. 22B is detected by the CCD.

Thus, when the FFT phase detection method is used, the spatial frequency to be processed changes with the process conditions, and it is necessary for a processing system to provide high precision to spatial frequencies in a wide range and to execute the processing without offset (difference between measured values corresponding to the spatial frequencies). This applies a large burden to the processing system, and leads to a difficulty in assuring high-precision processing to a fixed spatial frequency.

Further, in such a bright-field detection method, the S/N ratio is low particularly in a process using a small surface step.

When a detection optical system is adapted for dark-field observation such that an edge is lighted irrespective of the process condition, a wafer mark image such as shown in FIG. 22B can be detected stably.

However, the dark-field detection involves a problem with respect to scatter efficiency and it requires a large light quantity as compared with the bright-field detection. Like the bright-field detection, the S/N ratio is low particularly in a process using a small surface step.

It is accordingly an object of the present invention to provide an improved position detecting method or an improved projection exposure apparatus using the same.

In a position detecting method according to an aspect of the present invention, an alignment mark of a wafer may comprise a grating mark and it may be illuminated with monochromatic light of a wavelength different from the exposure light. On the basis of reflective diffraction light caused thereby, an interference image may be formed on the surface of an image pickup means. The image pickup means may produce an image signal on the basis of which a reticle-to-wafer alignment can be executed quickly and very precisely. Thus, high resolution projection exposure can be assured.

In an alignment method according to another aspect of the present invention, a grating mark formed on an object may be illuminated with monochromatic light. Of reflective diffraction light from the grating mark, ±n-th order light (n=1, 2, 3, . . .) may be used to form an interference image on the surface of an image pickup means. The image pickup means may produce an image signal. Within a two-dimensional window of a predetermined size which may be defined with respect to the image signal to be produced by the image pickup means, the image signal may be integrated in one direction of two-dimensional coordinates, whereby a one-dimensional projection integration signal may be produced. Through rectangular or orthogonal transformation, the produced signal may be transformed into a spatial frequency region. In this spatial frequency region, a spatial frequency component that may appear in the interference image based on the periodicity of the grating mark may be selected out of the one-dimensional projection integration signal.

On the basis of the selection, the position of the grating mark may be detected. In this detection, reflection angle information about reflection light from the object may be detected by detecting means, which information may be used to correct the detection of the position of the grating mark.

In a projection exposure apparatus according to a further aspect of the present invention, a reticle having a pattern may be illuminated with exposure light by which the pattern may be projected on a wafer through a projection lens. The wafer may have a grating mark which may be illuminated, through the projection lens, with monochromatic light from illumination means. Reflective diffraction light from the grating mark, passing through the projection lens, may be directed by a reflection member out of the exposure light path. Of the reflective diffraction light, ±n-th order light (n=1, 2, 3, . . . ) may be selected by using a stopper, and the selected n-th order light may be used with optical means to form an interference image on the surface of an image pickup means. The image pickup means may produce an image signal. Within a two-dimensional window of a predetermined size which may be defined with respect to the image signal to be produced by the image pickup means, the image signal may be integrated in one direction of two-dimensional coordinates, whereby a one-dimensional projection integration signal may be produced. Through rectangular or orthogonal transformation, the produced signal may be transformed into a spatial frequency region. In this spatial frequency region, a spatial frequency component that may appear in the interference image based on the periodicity of the grating mark may be selected out of the one-dimensional projection integration signal. On the basis of the selection, the position of the grating mark may be detected.

The projection lens may be aberration corrected with respect to the exposure light. The monochromatic light from the illumination means may have a wavelength different from the exposure light. The optical means may include a correction optical system for correcting aberrations to be produced when the grating mark of the wafer illuminated with the monochromatic light is projected on a predetermined plane by the projection lens.

The detecting means may detect a peak of frequency intensity distribution in the neighborhood of the spatial frequency which may inherently appear due to the periodicity of the grating mark, as a result of rectangular transformation of the one-dimensional projection integration signal into the spatial frequency region. Weighted averaging may be made by using the phase and intensity of each frequency component in the neighborhood of the peak.

On the basis of the detection by the detecting means of the peak of the frequency intensity distribution in the neighborhood of the spatial frequency inherently appearing due to the periodicity of the grating mark as a result of rectangular transformation of the one-dimensional projection integration signal into a spatial frequency region, the projection magnification for the grating mark may be corrected.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 9A and 9B each illustrates a reflection member usable in the present invention.

FIG. 10 is a schematic view for explaining a reflection member usable in the present invention.

FIG. 11 is a schematic view for explaining a reflection member usable in the present invention.

FIG. 17 is a schematic view for explaining a portion of the FIG. 16 embodiment.

FIG. 18 is a schematic view for explaining a portion of the FIG. 16 embodiment.

FIG. 19 is a schematic view of a known type off-axis alignment system.

FIG. 20 is a schematic view of a known type exposure light TTL alignment system.

FIG. 21 is a schematic view of a known type non-exposure light TTL alignment system.

DESCRIPTION OF THE PREFERRED EMBODIMENTS

Figure 1:
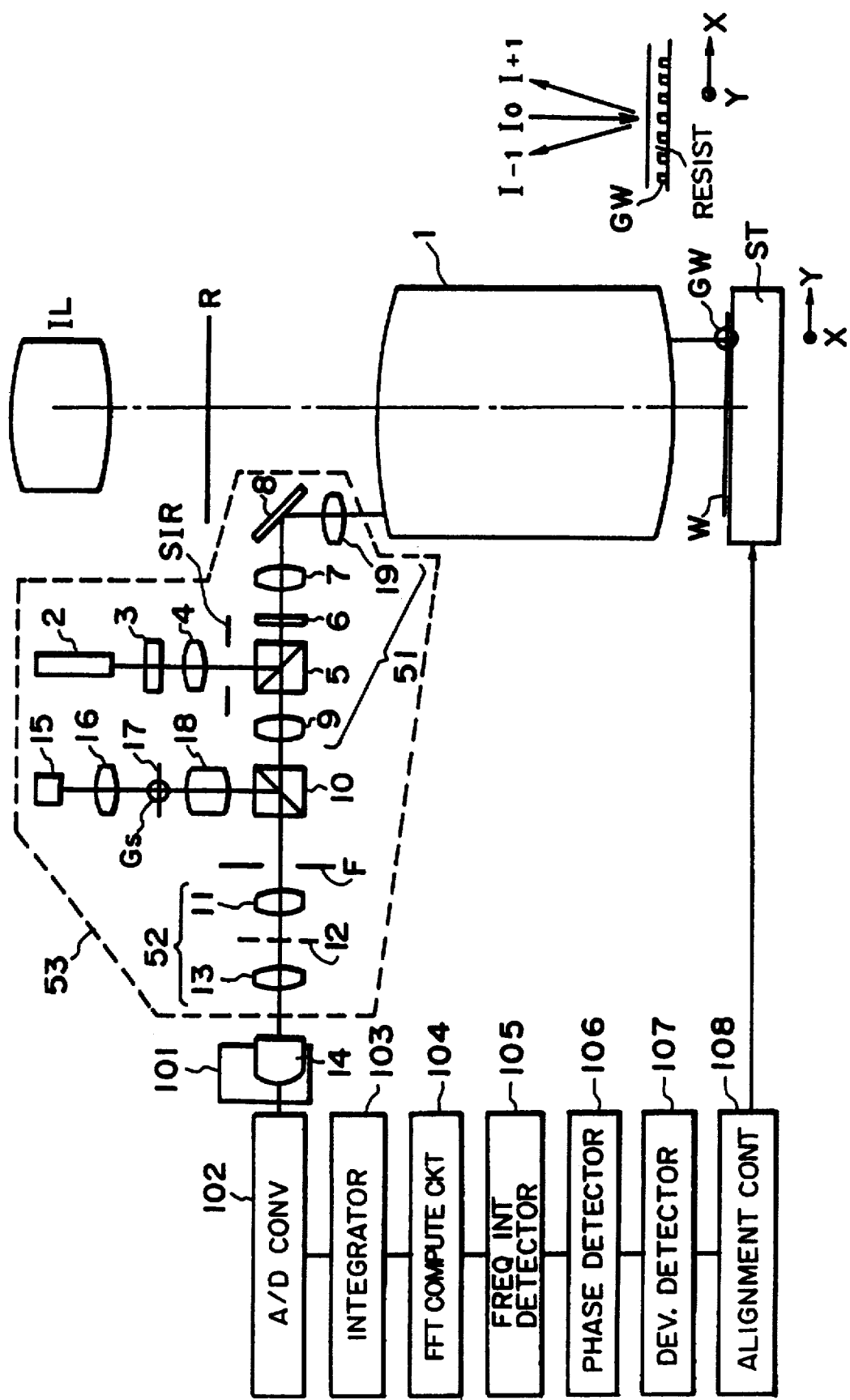
FIG. 1 is a schematic and diagrammatic view of a main portion of a projection exposure apparatus according to a first embodiment of the present invention.

Referring to FIG. 1 showing a main portion of a projection exposure apparatus according to the present invention, which is usable for manufacture of semiconductor devices, a reticle R is illuminated with exposure light from an illumination device IL and an electronic circuit pattern of the reticle R is projected by a projection lens 1 in a reduced scale upon a wafer W which is placed on a wafer stage ST. By this, the circuit pattern is transferred to the wafer W and, from this, semiconductor devices are produced.

Now, the components of aligning means of the FIG. 1 embodiment will be explained.

Denoted at 53 is a detection optical system having a reference mark GS. Denoted at 101 is an image pickup device having a solid image pickup element 14, and denoted at GW is a wafer mark (which also will be referred to as a "grating mark" or an "alignment mark") formed on the wafer.

In this embodiment, by using an appropriate detection system, the relative position of the reticle R relative to the projection lens 1, the detection optical system 53 and the image pickup device 101 is detected beforehand. And, by detecting the position upon the image pickup surface of the image pickup device 101 of the image as projected of the wafer mark GW of the wafer and the reference mark GS in the detection optical system 533, the reticle R and the wafer W are relatively and indirectly aligned with each other.

Next, the manner of detecting the position of the wafer mark GW of the wafer W and positioning the wafer to a desired location, in the alignment process of this embodiment, will be explained.

Linearly polarized light emitted by a He—Ne laser 2 and having a wavelength $\lambda$ different from that of the exposure light, is projected on an acousto-optic element (AO element) 3 by which the quantity of light directed to a lens 4 is controlled. For example, in a certain state the light is completely blocked.

Light passing through the AO element 3 is collected by the lens 4 and, while the range of illumination being spatially restricted by means of a field stop SIL disposed on a plane optically conjugate with the wafer W, it is projected on a polarization beam splitter 5. The polarization beam splitter 5 reflects the light and, through cooperation of a quarter waveplate 6, a lens 7, a mirror 8, another lens 19 and the projection lens 1, the light illuminates the wafer mark GW on the wafer W perpendicularly.

Figure 4A:
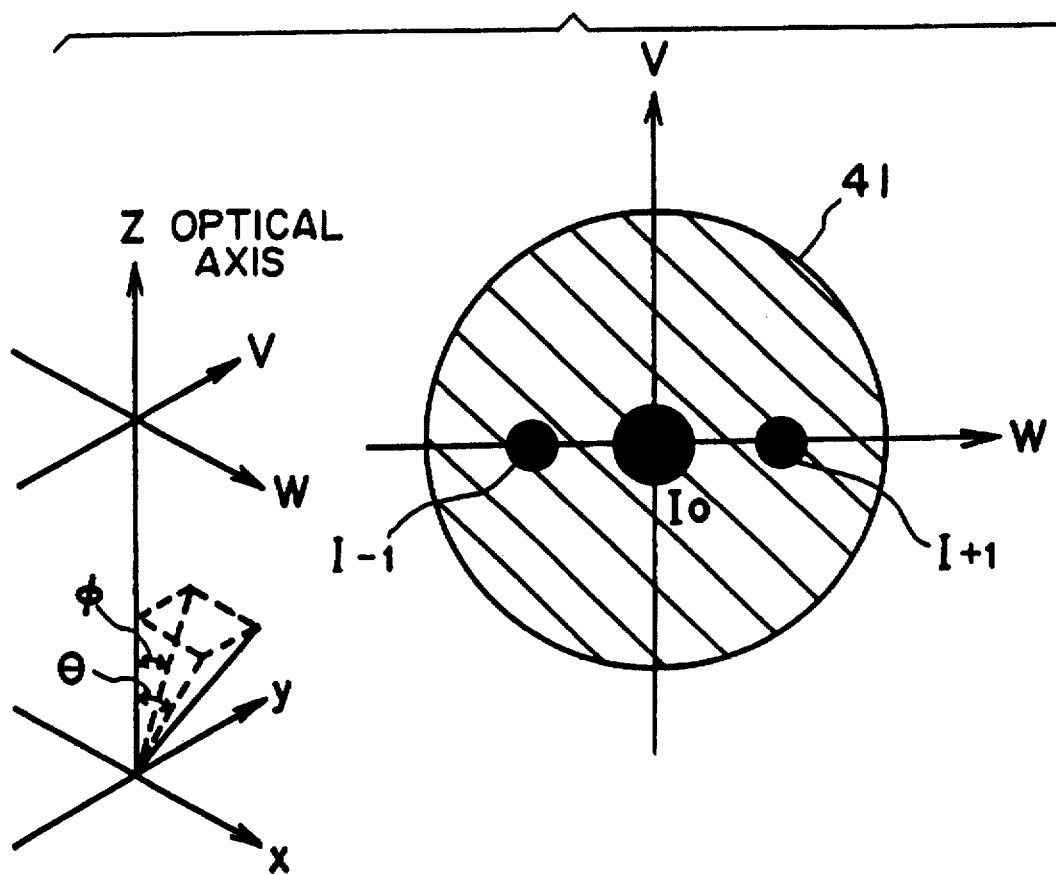
FIG. 4 is a representation for explaining a grating mark and a pupil plane of a projection exposure apparatus according to the present invention.
Figure 4B:
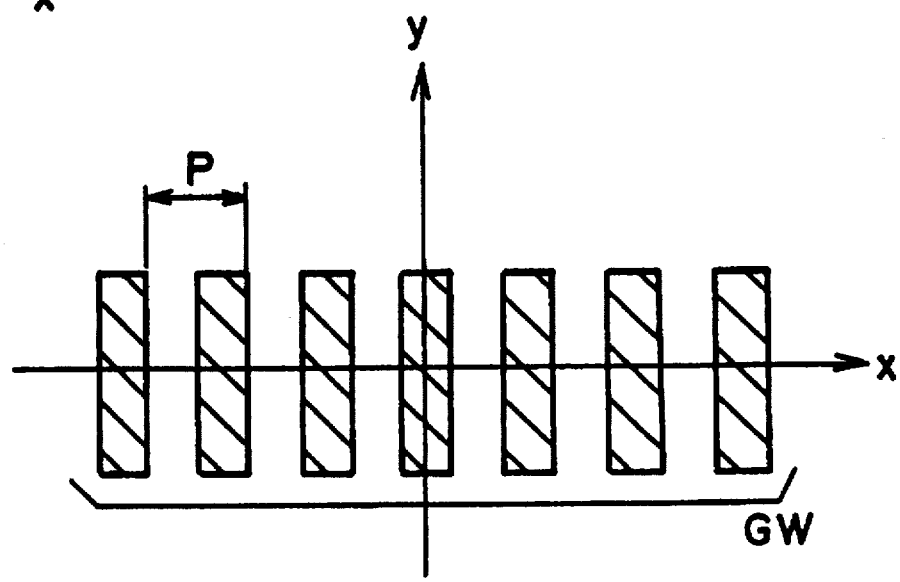

Here, on the pupil plane of an optical system constituted by the projection lens 1 and the lenses 7 and 19 (i.e. on the Fourier transformation plane of an image plane corresponding to the wafer W surface), the illumination light comprises light 41 such as depicted in FIG. 4(A). It impinges on the wafer W surface substantially perpendicularly. Reference characters V and W in FIG. 4(A), denote coordinates of the pupil plane and represent a distribution of an angle of incidence of the illumination light on the wafer W surface. The wafer mark GW of the wafer W comprises a grating mark having a diffraction grating of a pitch P, such as shown in FIG. 4(B). Each hatched zone and a surrounding zone in FIG. 4(B), are different in size of the surface step on the wafer W surface, in reflectivity or in phase, for example, and they define a diffraction grating.

Light reflected by the wafer mark GW passes the projection lens 1. Then, it goes via the lens 19, the mirror 8, the lens 7, the quarter waveplate 6 and the polarization beam splitter 5 in this order and through the lens 9 and the beam splitter 10, it forms an aerial image of the wafer mark GW, at the position F.

Light from the aerial image of the wafer mark GW formed at the position F passes a Fourier transformation lens 11 and impinges on a stopper 12. By this stopper, of the reflective diffraction light from the wafer mark GW, only the reflective diffraction light beam which corresponds, for example, to an angle $\pm\sin^{-1}(\lambda/P)$ on the wafer W is allowed to pass. Then, through another Fourier transformation lens 13, an interference image of the wafer mark GW is formed on the solid image pickup element (image pickup means) 14.

This interference image is an image of the wafer mark GW, forming a diffraction grating of a pitch P as illuminated with monochromatic light. Thus, both the signal light quantity and the contrast are sufficiently high and stable as compared with a dark-field image formed by using mere scattered light.

Here, the lenses 19, 7 and 9 constitute a correction optical system 51 for correcting aberration (mainly, on-axis chromatic aberration or spherical aberration) to be produced by the projection lens 1 with respect to the wavelength of the light illuminating the wafer mark GW.

It is not necessary for the correction optical system 51 of this embodiment to execute the aberration correction to all the light rays impinging on the aperture. Only required therefor is to execute the aberration correction to those reflective diffraction light beams passing through the stopper 12. Thus, the optical arrangement is quite simple.

This is very effective particularly in the case of what can be called an excimer stepper wherein light from an excimer laser is used as the exposure light, since the quantity of aberration produced to the illumination light is very large as compared with a case of a projection exposure apparatus wherein light of g-line or i-line is used.

Figure 5:
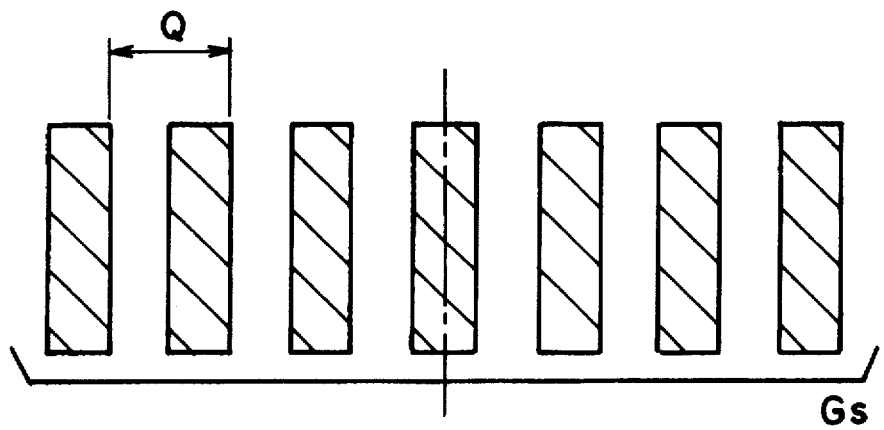
FIG. 5 is an enlarged view of a reference mark usable in the present invention.

On the other hand, in this embodiment, light from a light source 15 (e.g. LED) which emits a wavelength different from that of the illumination light for the wafer mark GW, is collected by a condenser lens 16. Then, it illuminates a reference mark GS which is formed on a reference mask 17. The reference mark GS comprises a grating mark such as shown in FIG. 5, for example, like the wafer mark GW. In the illustrated example, each hatched zone depicts a transparent region while a surrounding zone depicts a non-transparent region.

Light passing through the reference mark GS is collected by a lens 18. Then, it goes via a beam splitter 10 having an optical property effective to reflect the light from the LED 15 and to transmit the light from the He—Ne laser 2, whereby an aerial image of the reference mark GS is formed on the plane F.

After this, the aerial image of the reference mark GS on the plane F is imaged on the solid image pickup device 14 through the Fourier transformation lenses 11 and 13, in the same manner as the wafer mark GW. In this embodiment, the optical system 52 provided by the Fourier transformation lenses 11 and 13 is well aberration corrected with respect to two wavelengths of the illumination lights to the reference mark GS and the wafer mark GW.

It is to be noted that the light from the light source 15 may have the same wavelength as the illumination light to the wafer mark GW and, by replacing the beam splitter 10 by a polarization beam splitter, the light paths may be combined. On that occasion, the optical system 52 may be required to execute aberration correction only with respect to the illumination wavelength to the wafer mark GW.

The stopper 12 serves as a pupil plane filter, to the intensity distribution of the reflection light from the wafer mark GW produced in response to impingement of the illumination light on the wafer W surface. As a result, the light impinging on the solid image pickup device 14 comprises $\pm$n-th order diffraction light from the wafer mark GW, only (where n=1, 2, 3, . . . ).

Figure 2A:
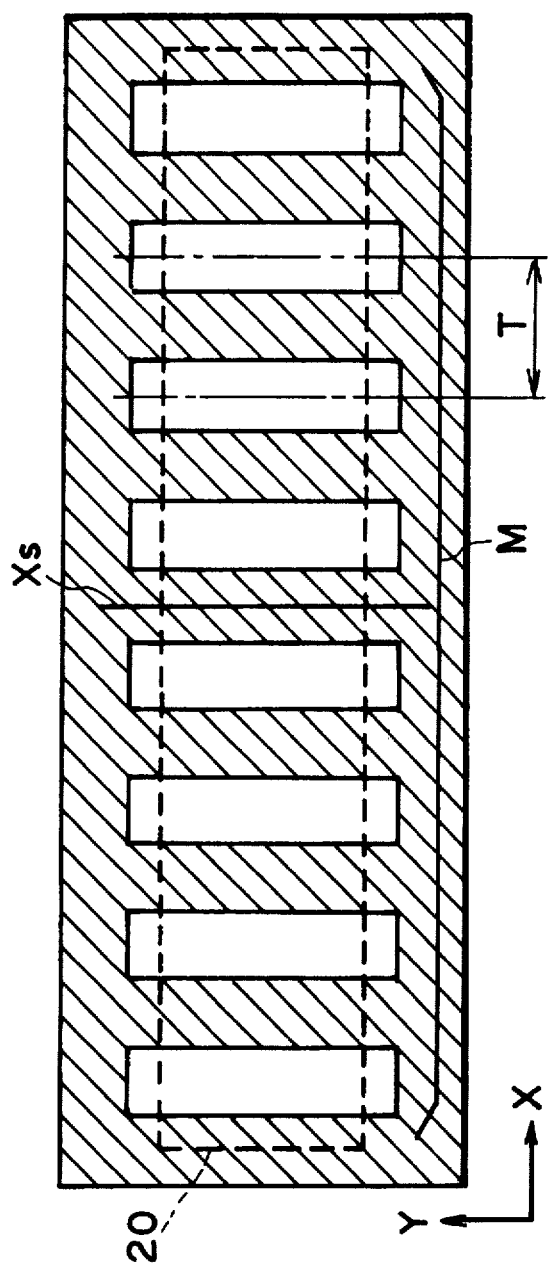
FIGS. 2A and 2B are representations for explaining an interference image of a grating mark, formed on an image pickup means of FIG. 1.

This embodiment uses $\pm$ first order diffraction light only, and an interference image M of the wafer mark GW such as shown in FIG. 2A is formed on the solid image pickup device 14. The interference image M provides intensity distribution of a cosine function having a period T which can be represented as:

$$T = \beta \cdot P/2$$

($\beta$ is imaging magnification)
and the distribution has a positional deviation of an amount corresponding to the positional deviation of the wafer mark GW of the wafer W from the optical axis.

The interference image M produces a desired intensity distribution as a cosine function having a period T, regardless of any change in the film thickness of a surface resist or the depth of a surface step of the wafer mark GW.

In this embodiment, the diffraction light to be selected by the stopper 12 is not necessarily limited to ± first order diffraction light. A pupil plane filter adapted to transmit only ± n-th order diffraction light (n=1, 2, 3, . . . ) may be used.

The selectability of different orders may be equivalent to the changeability of wavelength. Thus, it is effective to improve the rate of detecting the wafer mark GW. For example, if there is small ± first order diffraction light, then ± second order diffraction light may be used and, by doing so, it is possible to increase the detection rate of the wafer mark GW.

A coordinate position of the pupil filter is the position corresponding to an angle ± $\sin^{-1}(n\lambda/P)$ on the wafer W, and what is imaged on the solid image pickup device 14 is the cosine function of a period T=β·P/(2n).

In this embodiment, the images of the reference mark GS and the wafer mark GW, imaged on the solid image pickup device 14 have the same pitch T, this being assured by determining beforehand the pitches Q and P of the reference mark GS and the wafer mark GW, respectively in accordance with respective imaging magnifications. This enables analysis with a fixed frequency, in the phase difference detection in FFT processing, to be described later.

In the apparatus of this embodiment, the relative position of the reticle R relative to the projection lens 1, the detection optical system 53 and the image pickup device 101 including the solid image pickup means 14, is detected beforehand by using a suitable detecting means.

Thus, the alignment operation is based on detection of the positions of the images of the reference mark GS and the wafer mark GW, on the image pickup surface of the image pickup device 101 including the solid image pickup element 14.

Namely, the relative position of the wafer mark GW of the wafer W and the reference mark GS of the reference mask 17 is detected. Then, by using the thus produced detection data and the preparatorily detected data about the relative position of the reference mark GS and the wafer mark GW, the alignment of the reticle R and the wafer W is executed.

The images of the wafer mark GW and the reference mark GS, imaged as the detected mark image on the solid image pickup element 14, are converted into two-dimensional electric signals. FIG. 2A illustrates the image pickup surface of the image pickup device 101 on which the detected mark image is formed.

In FIG. 2A, the interference image M corresponds to the detected mark. Where the direction in which the position of the pattern is to be detected is along the X axis in FIG. 2A, the detected mark M has an intensity distribution pattern of a cosine function having a period T along the X axis. By forming such a detected mark M, the sectional shape of the pattern in the X axis direction becomes symmetric with respect to the center Xs of the pattern to be detected.

The pattern image as converted by the image pickup device 101 into a two-dimensional electric signal, is then converted by an analog-to-digital (A/D) converting device 102 of FIG. 1 into a two-dimensional discrete electric signal train corresponding to X and Y addresses of picture elements of the two-dimensional image pickup element 14, with the sampling pitch Ps determined by the picture element pitch of the image pickup surface and the optical magnification of the detection optical system 53 and the projection lens 1.

Figure 2B:
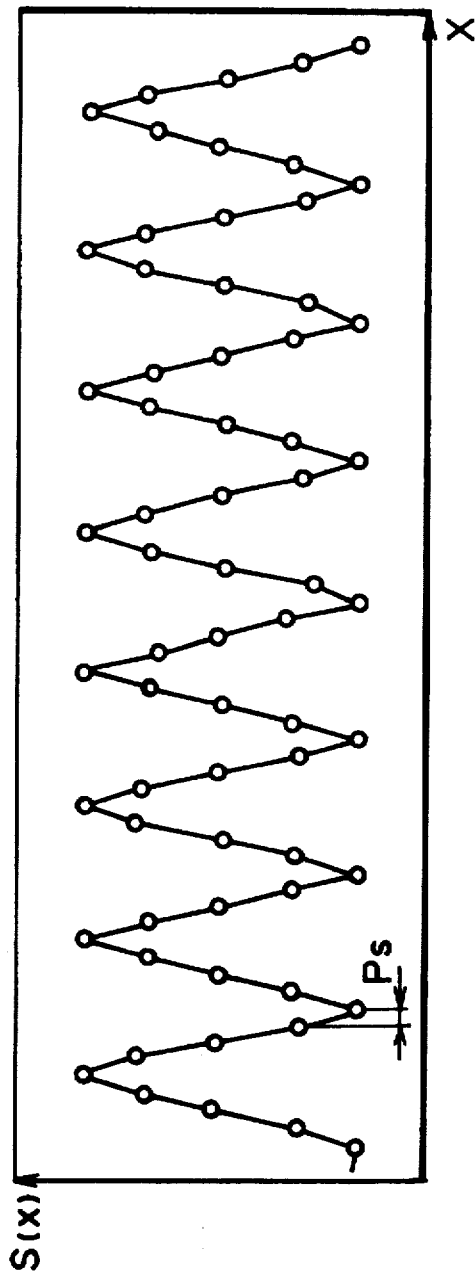

Denoted at 103 in FIG. 1 is an integrating device. After a predetermined two-dimensional window including the detected mark M such as shown in FIG. 2A is set, the integrating device 103 serves to execute picture element integration within the window 20 and in the Y direction depicted in FIG. 2A, and it produces an electric signal train S(x) discrete in the X direction as shown in FIG. 2B.

Denoted at 104 in FIG. 1 is an FFT operation device which serves to execute discrete Fourier transformation of the received electric signal train S(x), transforming the electric signal train S(x) into a spatial frequency region, and calculates its Fourier coefficient quickly. The operation is based on N-point (n=2r) fast Fourier transformation (FFT) which is known per se (e.g. "Fast Fourier Transformation", Chapter 10, E. Oran Brigham). If the sampling frequency fs=1, the complex Fourier coefficient X(k) of frequency f(k)=k/N is given by:

$$X(k) = \sum_{n=0}^{N-1} S(x)e^{a} \qquad (1)$$

where a=-j·2π(k/N), and n and j each is an imaginary number unit.

Also, the intensities E(k) and θ(k) of the spatial frequency f(k) are:

$$E(k)=((Re(X(k)))^2+(Im(X(k)))^2)^{1/2} \qquad (2)$$

$$\theta=\tan^{-1}(Im(X(k))/Re(X(k))) \qquad (3)$$

where Re(X(k)) and Im(X(k)) denote real and imaginary parts of a complex number X(k).

Figure 3A:
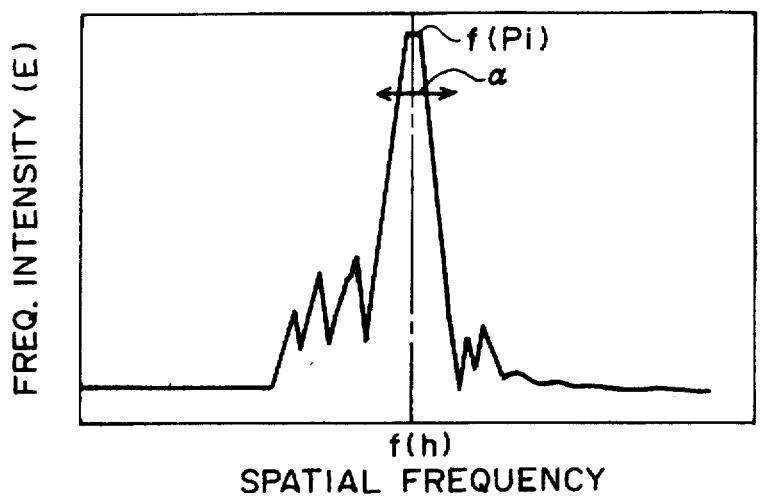
FIGS. 3A–3C are representations for explaining signal processing related to an interference image of the present invention.

FIG. 3A illustrates a distribution of the spatial frequency intensity E(k) produced when FFT operation is done so as to cover the whole detected mark while taking, as a reference point, the point Xs near the center of the detected mark M as determined beforehand by using a suitable detecting means.

Based on the periodicity of the pattern, the intensity of the spatial frequency f(h)=(Ps/T)·N peculiar to the pattern, appearing in the one-dimensional discrete signal S(x) of the pattern becomes high, and a peak is defined in the graph of FIG. 3A.

Denoted at 105 in FIG. 1 is a spatial frequency intensity detecting device which serves to detect the peak position Pi and the peak frequency f(Pi), in a range α near the spatial frequency f(h) peculiar to the pattern, in accordance with equation (4):

$$Pi=\{k|\max (E(k),f(h)\cdot N-\alpha<k<f(h)\cdot N+\alpha, k=0,1,2,\ldots,N-1\} \qquad (4)$$

where α is a positive integer which is determined so that, to a change in pitch of the pattern, Pi becomes significant.

On the other hand, provided that it is within the range α, even if the optical magnification deviates from a predetermined value due to some reason such as the state of adjustment of the optical system, for example, detecting the frequency f(Pi) corresponding to this peak makes it possible to correct the change in optical magnification from the spatial frequency peculiar to the pattern. For the peak detection, if necessary, complementary means (e.g. least square approximation or weighted averaging processing) may be used in the spatial frequency region to thereby enhance the spatial frequency resolution.

Denoted at 106 in FIG. 1 is a phase detecting device which serves to detect the peak f(pi) of the spatial frequency intensity and the phase at the reference point Xs in the neighborhood thereof, in accordance with equation (3).

Denoted at 107 in FIG. 1 is a deviation detecting device which is adapted to calculate a deviation $\Delta_k$ in real space, from the phase and in accordance with equation (5):

$$\Delta_k = (1/2\pi) \cdot (N/K) \cdot P_s \cdot \theta_K \tag{5}$$

Figure 3B:
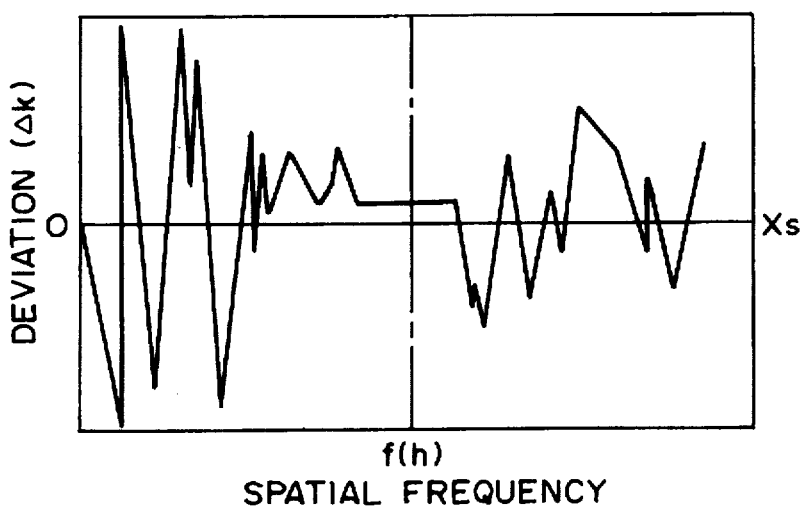

FIG. 3B is a graph wherein deviation $\Delta_k$ in the neighborhood of the frequency region peculiar to the pattern is plotted. Generally, as shown in FIG. 3B, the deviation $\Delta_k$ near the frequency peculiar to the pattern is stably at a constant level. Thus, weighted averaging processing based on the frequency intensity is executed to each deviation $\Delta_k$ calculated, and a deviation $\Delta c$ of the pattern of center from the reference point Xs is detected in accordance with weighted averaging (equation (6)):

$$\Delta c = \frac{\{\Sigma\{E(k) \cdot \Delta_k\}\}}{\displaystyle\sum_{\substack{f(Pi) \cdot N - \\ \alpha < K < f(Pi) \cdot N + \alpha}}} \Bigg/ \frac{\{\Sigma\{E(k)\}\}}{\displaystyle\sum_{\substack{f(Pi) \cdot N - \\ \alpha < K < f(Pi) \cdot N + \alpha}}} \tag{6}$$

Figure 3C:
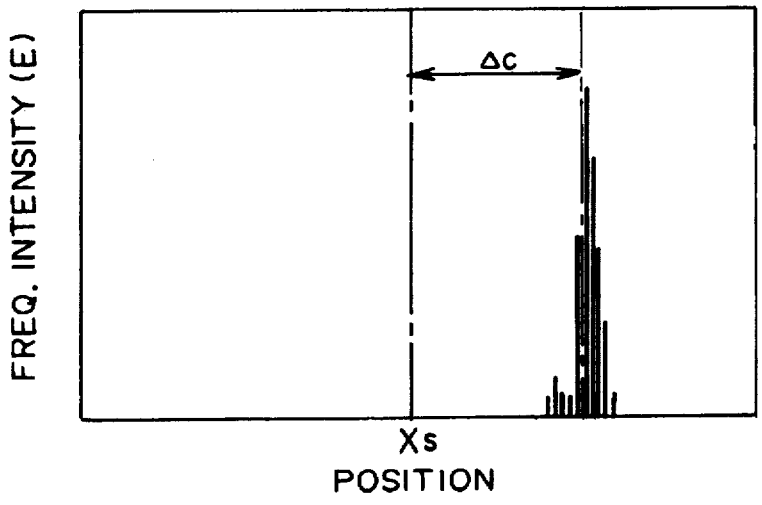

FIG. 3C depicts the result of such weighted averaging processing. Thus, the detection of deviation $\Delta c$ can be done with enhanced S/N ratio and reduced volume of calculation while paying attention solely to the signal of the detected pattern, as well as stabilized detection due to weighted averaging processing.

While in this example the FFT process is used to calculate the Fourier coefficient, it is a possible alternative to directly calculate only the Fourier coefficient of the required frequency component in accordance with equation (1), utilizing the fact that the spatial frequency peculiar to the pattern does not change largely.

On that occasion, the number of sampling points can be selected as desired. Therefore, while taking into account that the frequency component resulting from the discrete Fourier transformation can be represented by k/N, it is possible to detect the spatial frequency peculiar to the pattern exactly by selecting the sampling point number N so that k/N becomes closest to the frequency component to be detected. Also, by reducing the frequency component used in the detection, the volume of calculation can be diminished.

In the manner described, the relative position of the wafer mark GW of the wafer W and the reference mark GS of the reference mask 17 is detected and, on the basis of the thus produced detection data as well as preparatorily obtained data on the relative position of the reference mark GS and the reticle R, alignment of the reticle R and the wafer W is executed.

While in this embodiment any positional deviation between the wafer mark GW and the reference mark GS is detected, in place of the reference mark GS a reticle mark of the reticle R may be imaged on the solid image pickup device 14 through an optical system and any relative positional deviation between the reticle mark and the wafer mark GW may be detected directly.

Further, in place of imaging the reference mark GS on the solid image pickup device 14, a reference mark may be imaginarily set on an image memory, provided to record the signals of the solid image pickup means 14 and the thus set imaginary mark may be used in substitution for the reference mark GS.

Still further, the object to be aligned may be provided with grating marks along X and Y directions, respectively, and by using separate optical systems each having the structure described above, the position with respect to each of the X and Y directions may be detected. The grating mark may comprise a check pattern, such that the detecting operations in the X and Y directions may be done simultaneously or alternately by using one and the same optical system. This applies to some embodiments to be described below.

A projection exposure apparatus according to a second embodiment of the present invention will now be explained. This embodiment has a feature that the opening NA of the stopper 12 is specified.

Figure 6:
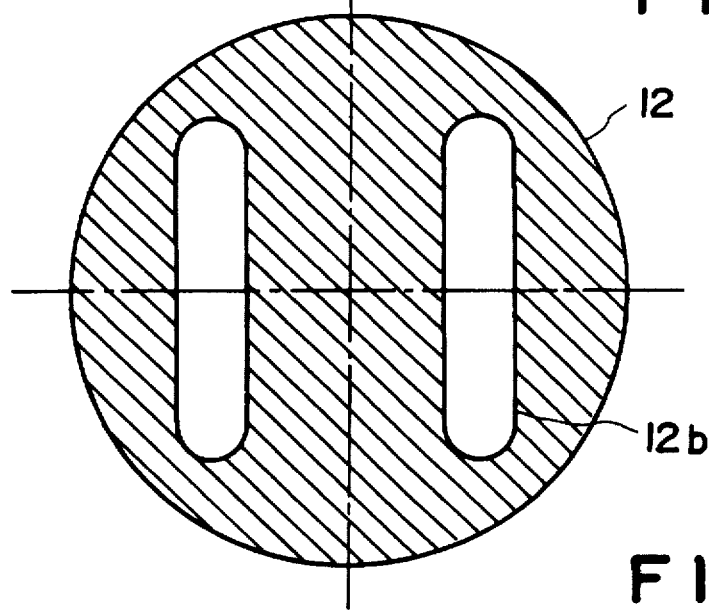
FIG. 6 is an enlarged view of a stopper with openings.

In the structure shown in FIG. 1, if the opening NA (aperture shape) of the stopper 12 is changed to one as depicted at 12b in FIG. 6, for example, namely, if it is changed to define a relatively large NA with respect to a direction perpendicular to the direction with respect to which the interference fringe formed on the image pickup means 14 surface is to be evaluated and with respect to which the alignment operation is to be done, there are cases wherein unwanted imagewise information within or around the grating mark GW of the wafer (object) W is transmitted to the image pickup means 14, thus degrading the S/N ratio.

More specifically, there are cases wherein random detection errors occur during the alignment operation in a process having large surface irregularity or wherein any foreign particle or fault in or about the grating mark GW causes measurement errors.

Also, when a monochromatic light source is used as the illumination light, there occurs speckle noise. If some oscillating means such as typically a diffusion plate is used to reduce the effect of the speckle noise, generally the light quantity loss becomes large. This results in a reduced S/N ratio or, if the condition is not good (e.g. small surface step process or low reflectivity of the substrate), it ends in failure of detection due to insufficiency of illumination light.

Further, if the opening NA to the reflective diffraction light becomes large, the aberration of the projection lens to the illumination wavelength of non-exposure light in the non-exposure TTL system becomes very large particularly in a case where an excimer laser is used as the exposure light. This necessitates a complicated optical system for correcting the aberration of the projection lens, or makes it impossible to structure a practical correction optical system itself.

In consideration of these inconveniences, in the present embodiment the aperture condition of the stopper 12 is set properly to remove these inconveniences and to assure high precision alignment operation.

If the opening angle of the stopper to each reflective diffraction light, at the wafer side, is NA, the wavelength of the illumination light is $\lambda$ and the cut-off frequency of the optical system (transmittable critical frequency) is Nc, then Nc is given by:

$$Nc = 2 \cdot NA/\lambda$$

On the other hand, where the spatial frequency of the interference fringe formed on the image pickup means 14 which is to be detected is T and the absolute value of the optical magnification between the wafer W and the image pickup means 14 is $\beta$ and if the spatial frequency T is converted into a spatial frequency Tw on the wafer W, then it can be expressed as follows:

$$Tw = T \cdot \beta$$

It is seen therefore that, by setting NA so that the cut-off frequency Nc becomes smaller than the spatial frequency Tw, it is possible to provide a state wherein unwanted imagewise information within or around the grating mark of the object is prevented from being transmitted to the image pickup means.

Thus, in the present embodiment, the opening NA of the stopper 12 is set to satisfy the following relation:

$$0 < NA < T \cdot \beta \cdot \lambda/2$$

Figure 7:
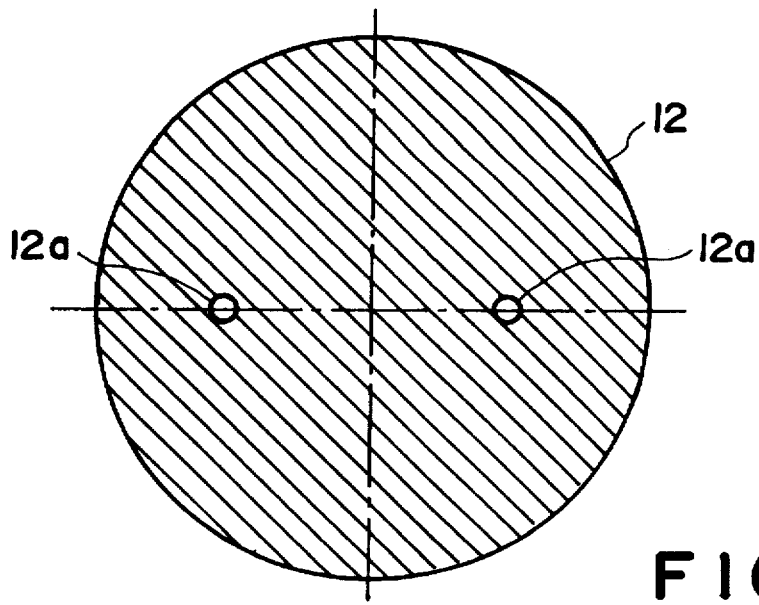
FIG. 7 is an enlarged view for explaining a stopper usable in the present invention.
Figure 8:
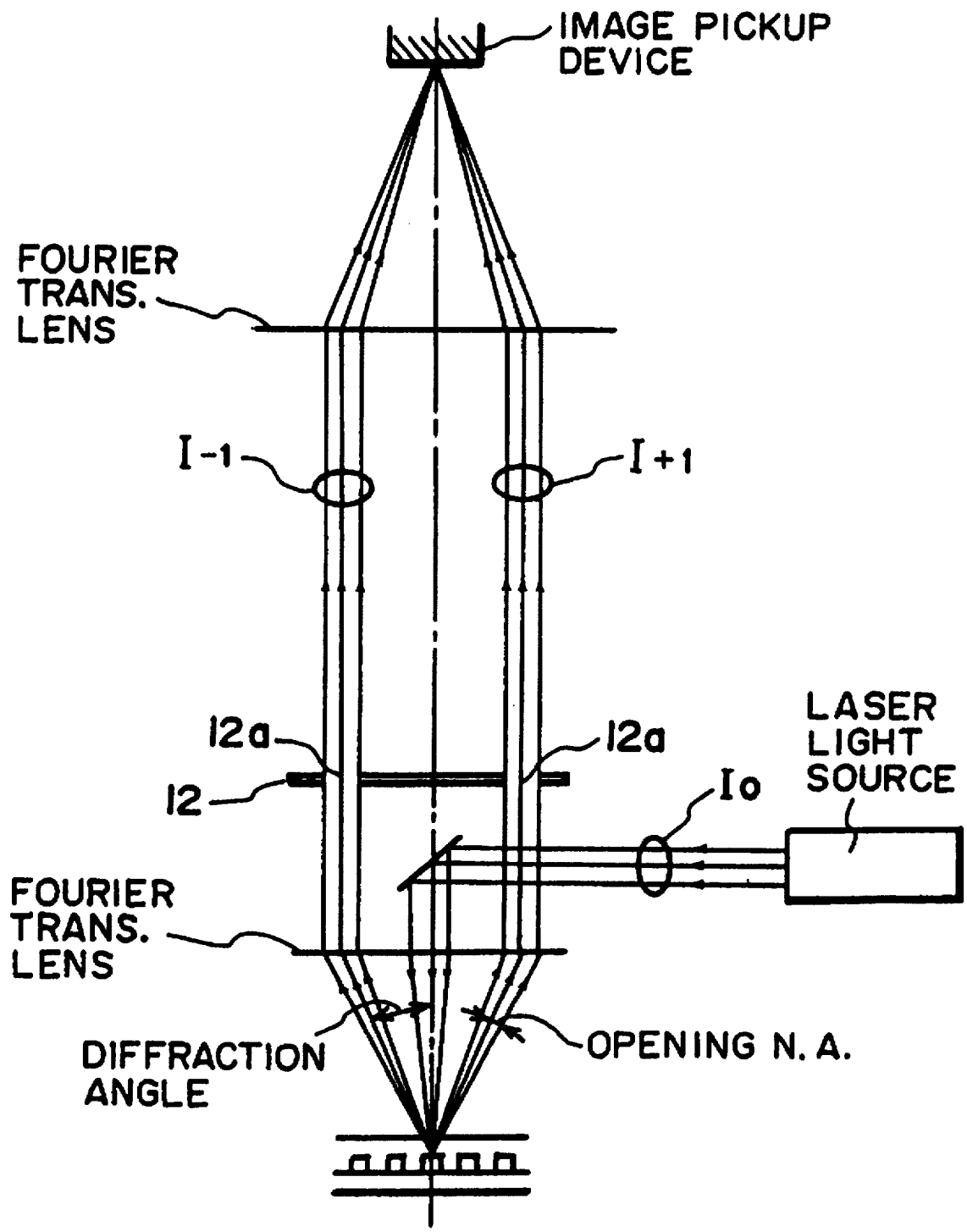
FIG. 8 is a partially extended schematic view of an optical system of a projection exposure apparatus according to the present invention.

FIG. 7 is a plan view of the stopper 12 of this embodiment, and FIG. 8 is a representation wherein the light path of FIG. 1 used with the stopper 12 of this embodiment is illustrated while being schematically extended. Denoted at 12a in FIG. 7 is the aperture of the stopper 12.

In this embodiment, the wavelength λ of illumination light for illuminating the grating mark GW of the wafer (object) W with monochromatic light is λ=633 nm, the absolute value β of the optical magnification from the wafer W to the image pickup means 14 is β=100×, and the spatial frequency T of the interference fringe formed on the image pickup means 14 is T=2. The opening NA which can be derived from the above-mentioned relation is set to satisfy NA<0.063 and, simultaneously, the opening NA of the stopper 12 at the wafer side to each reflective diffraction light, for selectively extracting the reflective diffraction light, is set to provide NA=0.03.

In this embodiment, by structuring the stopper 12 so that the opening NA satisfies the above-described conditions, transmission of unwanted imagewise information within or around the grating mark GW of the wafer (object) W to the image pickup means 14 as well as a resultant decrease of S/N ratio are prevented. Additionally, the necessity of using some oscillating means such as typically a diffusion plate for reducing the effect of speckle noise is removed, whereby loss of light quantity is avoided.

Further, the region for correcting aberration produced by the projection lens is limited to the opening NA portion to the signal light, and this makes any correcting optical system unnecessary or makes the correction optical system very simple such as a single lens correction optical system. As a result, stable position measurement with high S/N ratio is assured. Particularly, in a projection exposure apparatus using an excimer laser as exposure light, this embodiment assures a non-exposure light TTL type high precision alignment method.

A projection exposure apparatus according to a third embodiment of the present invention will now be explained.

This embodiment has a feature that the disposition of a reflection member 8 for directing the reflective diffraction light from the wafer mark GW, passed through the projection lens 1, outwardly of the exposure light path, is specified.

In this embodiment, reflective diffraction light being reflectively diffracted by the grating mark GW of the wafer (object) W which is to be aligned, passes the projection lens 1 and, after this, the light is directed by the reflection member 8 outwardly of the exposure light path. Here, if a mirror or a prism such as shown in FIG. 9A or 9B is used as the reflection member 8, the attitude thereof with respect to the inclination component in the direction in which the position of the grating mark GW is to be detected and in which the alignment operation is to be done may change with time due to the effect of environmental conditions (e.g. temperature, pressure or mechanical stability resulting from vibration). If such a change occurs, the measured value of the position changes.

The effect is illustrated in FIG. 10, and if the tilt of the mirror 8 is ε, the distance from the mirror 8 to the conjugate plane CS of the grating mark GW of the wafer W is d, and the absolute value of optical magnification from the wafer to the conjugate plane CS is β, then the position detection error $\Delta s_t$ can be expressed as follows:

$$\Delta s_t = d \cdot \tan \varepsilon / \beta$$

For example, if d=100 mm, β=5× and the tolerance for $\Delta s_t$ is 0.02 micron, then the mirror 8 has to be held with a very high attitude keeping precision of 0.2 sec.

In consideration of this, in this embodiment the position of the reflection surface of the reflection member 8 for extracting the reflective diffraction light out of the exposure light path is set in the neighborhood of the position which is conjugate with the grating mark GW with respect to the projection lens 1. By doing so, the effect of any change with time due to environmental conditions (e.g. temperature, pressure or mechanical stability) is minimized.

Here, the range of neighborhood of the conjugate position may be such a range in which slight tilt of the reflection member 8 does not largely affect the detection precision.

FIG. 11 shows the optical function wherein the reflection surface of the reflection member 8 is disposed in the neighborhood of the position which is conjugate with the grating mark GW. As depicted by a broken line in the drawing, any shift of the light path due to tilt of the reflection member 8 does not produce shift of the position of the interference image on the image pickup means 14.

As a result, this embodiment assures stable position measurement less affected by the environmental conditions and, particularly, in a projection exposure apparatus using an excimer laser as exposure light, non-exposure light TTL type high precision alignment operation is ensured.

Figure 12:
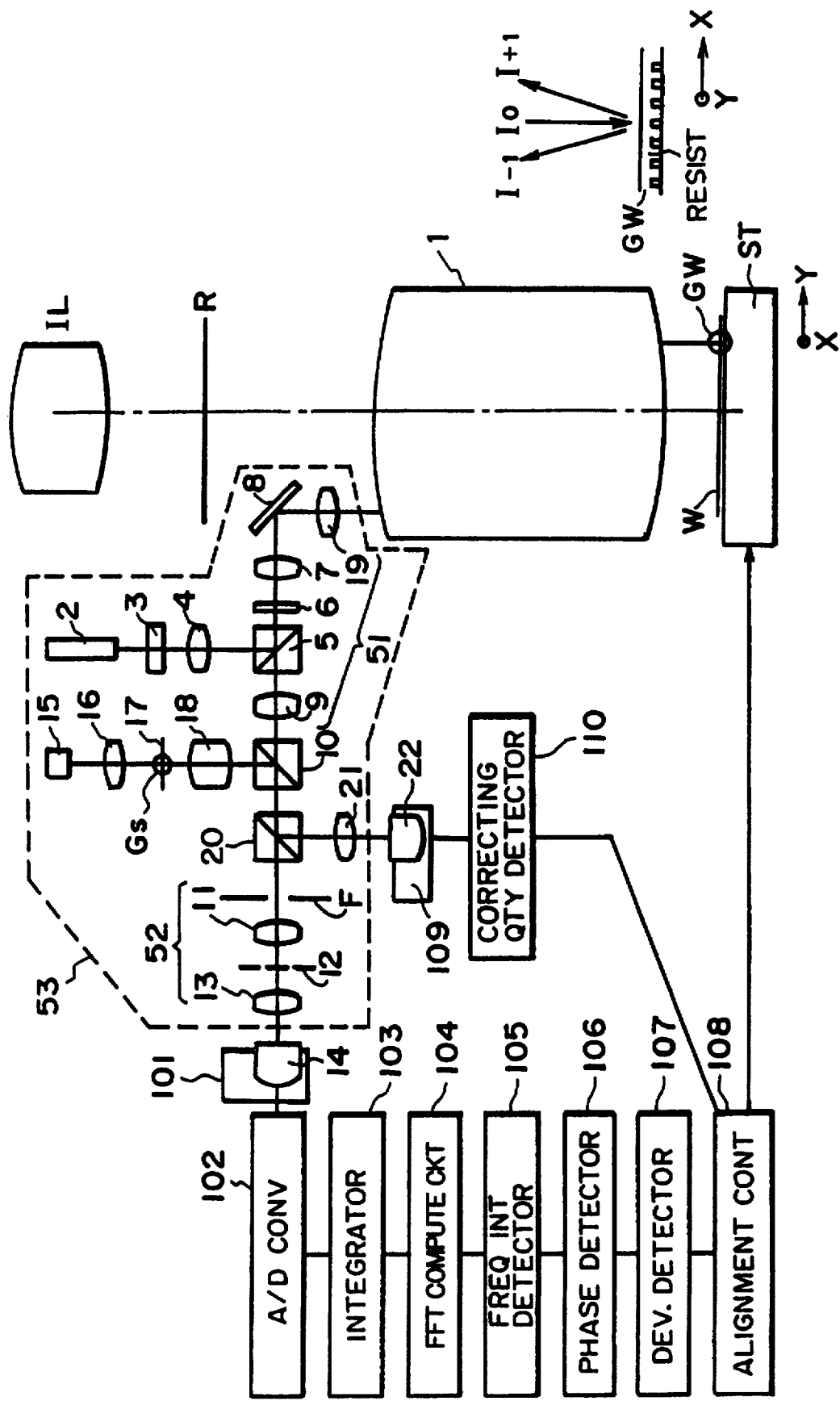
FIG. 12 is a schematic and diagrammatic view of a main portion of a projection exposure apparatus according to another embodiment of the present invention.

FIG. 12 is a schematic view of a main portion of a projection exposure apparatus according to a fourth embodiment of the present invention. Like numerals as those of FIG. 1 are assigned to corresponding elements.

In this embodiment, as compared with the FIG. 1 embodiment, the reflection angle of the reflection light (zeroth order light) from the wafer W is detected and, on the basis of the detected reflection angle, the position detection to the grating mark GW of the wafer W is corrected. The remaining portion is essentially of the same structure as the FIG. 1 embodiment.

Generally, an alignment mark (grating mark) GW of a wafer W optically changes due to a resist applied thereto. Particularly, asymmetrical non-uniformness of resist coating causes distortion of a wafer alignment signal, leading to a detection error. This detection error has a particularly adverse effect in the interference alignment method using a diffraction grating, as compared with the bright field observation method.

In consideration of this, in this embodiment the reflection angle of the reflection light from the wafer is detected during the grating mark position detection and alignment, on the basis of which any position detection error to the grating mark GW due to non-uniformness of the resist coating is corrected and alignment operation is executed.

More specifically, a solid image pickup device is disposed on a pupil plane of a detection optical system which defines the Fourier transformation plane of the image plane, corresponding to the wafer surface, and, from the imaging position of the wafer reflected light, the amount and direction of deviation of position detection to the grating mark resulting from non-uniformness of resist coating is detected. Then, the detected position as determined on the basis of the interference image formed on the solid image pickup device disposed on the image plane, is corrected. By this, high precision alignment is assured.

Now, an essential distinction of the fourth embodiment of FIG. 12 over the FIG. 1 embodiment will be explained.

Denoted at 20 is a beam splitter which serves as a half mirror to the wavelength of illumination light to the wafer mark GW, so as to produce light for correcting any deviation. Some portion of the wafer reflected light is reflected by this beam splitter 20 toward a Fourier transformation lens 21. The wafer reflected light as collected by the Fourier transformation lens 21 impinges on a solid image pickup device 22 which is conjugate with the stopper 12.

Here, the surface of the solid image pickup device 22 corresponds to the pupil plane of the detection optical system (i.e. the Fourier transformation plane of the image plane corresponding to the wafer W surface), and the image pickup device serves to detect the information representing distribution of diffraction light from the wafer mark GW, as shown in FIG. 4A.

In this embodiment, the solid image pickup element 22 and the image pickup device 109 are constituents of the detecting means.

In this embodiment, by using the diffraction light distribution from the wafer mark GW as projected on the solid image pickup element 22, the quantity of correction to the deviation as detected by the deviation detecting device 107 is calculated in the manner to be described below.

In this embodiment, of the diffraction light from the wafer mark GW, any change in zeroth order light $I_0$ which is regularly reflected light from the wafer is used. The detection optical system 53 up to the solid image pickup device 22 is so structured that the illumination light impinges on the wafer W perpendicularly. Here, either a reference wafer or a horizontal reflection surface defined on the stage ST, having assured flatness and parallelism, is placed under the illumination zone, and by using the image pickup element 22 and through cooperation of the image pickup device 109 and the correction quantity detecting device 110, the position at which the zeroth order light $I_0$ is converged is measured and memorized. This position provides a reference position which is unchangeable under normal measurement conditions. However, if a resist is applied asymmetrically to the wafer W, this position may change.

Figure 13:
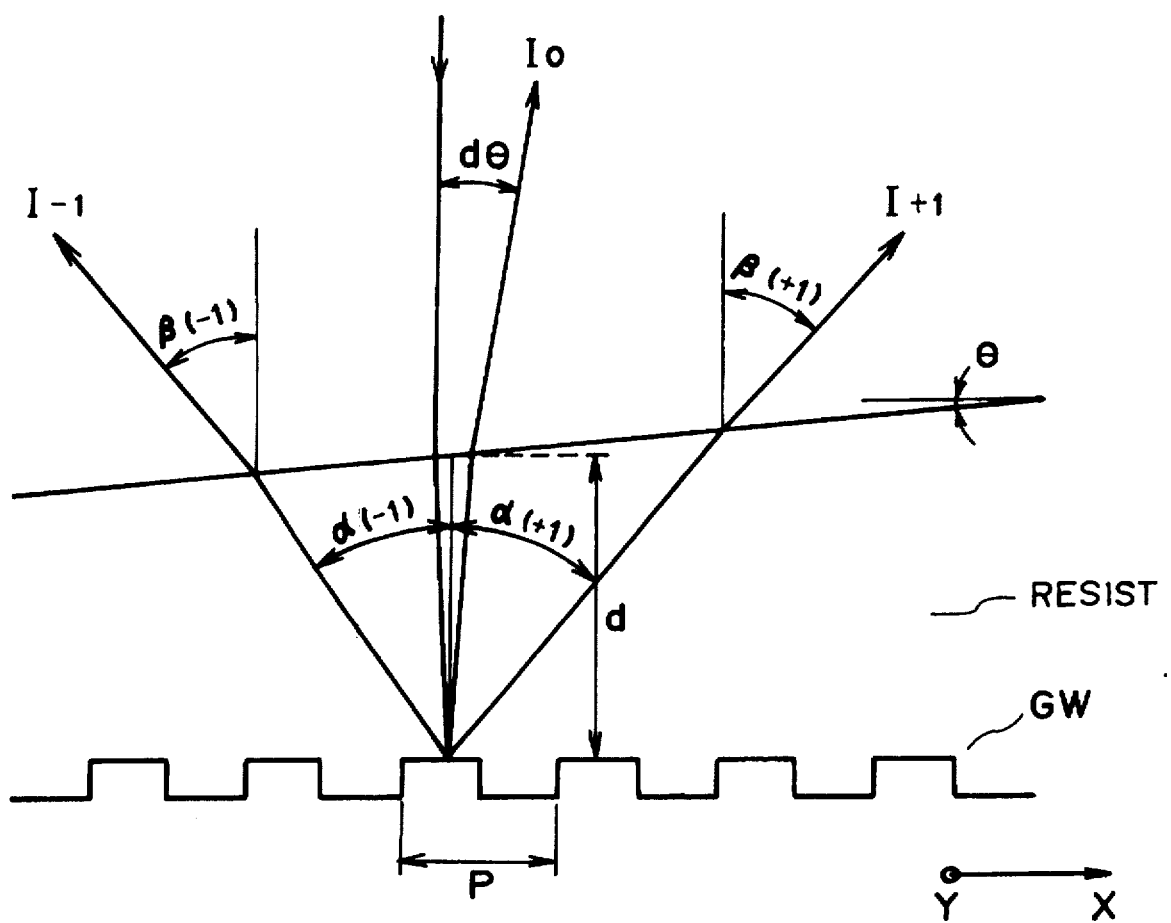
FIG. 13 is a representation for explaining a portion of the FIG. 12 embodiment.

FIG. 13 is a schematic view showing an example wherein a resist is applied with tilt of an angle θ in the measurement direction (X direction) to the wafer mark GW. If the refractive index of the resist is N and the average resist thickness is D, then the angular deviation dθ of the zeroth order reflection light $I_0$ from the perpendicularly incident light is expressed as follows:

$$d\theta = \sin^{-1}(N^*(\sin(2\theta - \sin^{-1}(\sin\theta/N)))) - \theta \quad (7)$$

This angular change is detected by the image pickup device 109 including the solid image pickup element 22, and it produces a deviation in the X-axis direction by dx from the position $X_0$ (including the imaging magnification from the angular deviation dθ on the wafer W surface).

Here, the measurement error Δe produced in the deviation Δc as calculated in accordance with equation (6) is such as follows: That is, like the zeroth order reflection light $I_0$, the ± first order reflection lights $I_{+1}$ and $I_{-1}$ used for the positional deviation detection involve an angular change due to the resist inclination. Their diffraction angles $\beta_{(+1)}$ and $\beta_{(-1)}$ are:

$$\beta_{(+1)} = \sin^{-1}(\lambda/P) + d\theta \quad (8)$$

$$\beta_{(-1)} = \sin^{-1}(\lambda/P) - d\theta \quad (9)$$

Angles $\alpha_{(+1)}$ and $\alpha_{(-1)}$ to the normal to the wafer mark GW are:

$$\alpha_{(+1)} = \sin^{-1}((\sin(\beta_{(+1)} + \theta))/N) - \theta \quad (10)$$

$$\alpha_{(-1)} = \sin^{-1}((\sin(\beta_{(-1)} - \theta))/N) + \theta \quad (11)$$

Since the path difference ΔL between the positive and negative first order diffraction lights $I_{+1}$ and $I_{-1}$, resulting from resist inclination, causes the measurement error Δe, if the wavelength of the illumination light is λ, then:

$$\Delta L = t^*(\cos\alpha_{(-1)} - N^*\cos\alpha_{(+1)})/(N^*\cos\alpha_{(-1)}^*\cos\alpha_{(+1)}) \quad (12)$$

$$t = 2^*d^*(\tan\alpha_{(-1)} + \tan\alpha_{(+1)})/(\tan\alpha_{(-1)} - \tan\alpha_{(+1)} + 2/\tan\theta)\Delta e = P^*\Delta L/\lambda \quad (13)$$

the measurement error Δe as determined from equation (13) is the amount of correcting the deviation Δc as calculated from equation (6).

The deviation dx, from the position $X_0$, of the zeroth order light detected by the image pickup device 109 including the image pickup element 22, is signaled to the correcting amount detecting device 110, and from the imaging magnification of the detection optical system 53, for example, the angular deviation dθ of the zeroth order reflection light $I_0$ from the perpendicularly incident light is determined.

From this angular deviation dθ and the refractive index N of the resist which is known, the resist inclination angle θ can be calculated in accordance with equation (7). Where the average resist thickness d is known, from equations (8)–(13) the measurement error Δe can be determined. The measurement error Δe is signaled to the alignment control device 108 to compensate for the deviation Δc signaled from the deviation detecting device 107, by which the positional deviation is detected correctly.

In the manner described above, the relative position of the wafer mark GW of the wafer W and the reference mark GS of the reference mask 17 is detected, and by using the thus produced detection data as well as preparatorily obtained data about the relative position of the reference mark GS and the reticle R, the alignment of the reticle R and the wafer W is executed.

Next, a fifth embodiment of the present invention will be explained.

While in the fourth embodiment zeroth order diffraction light (regularly reflected light) is used to calculate the positional deviation correcting quantity Δe, similar effects are attainable by detecting a change in the angle of ± n-th order reflection light that produce interference fringe on the solid image pickup device 14.

For example, if ± first order reflection light is to be used, among the pupil plane distribution of the diffraction light from the wafer mark GW formed on the solid image pickup device 22 such as shown in FIG. 4A, ± first order reflection lights $I_{+1}$ and $I_{-1}$ may be monitored. The angular deviation dθ from the perpendicularly incident light may be detected on the basis of the amount of change of these lights, from observation of the reference wafer, for example, to observation of a real wafer. Then, like the first embodiment, the measurement error Δe may be determined in accordance with equations (7) –(13).

By doing so, the operation can be made without modifying the FIG. 12 structure. Thus, only by the selection of light to be monitored by the image pickup device 109, this embodiment may be used in combination with the first embodiment.

Figure 14:
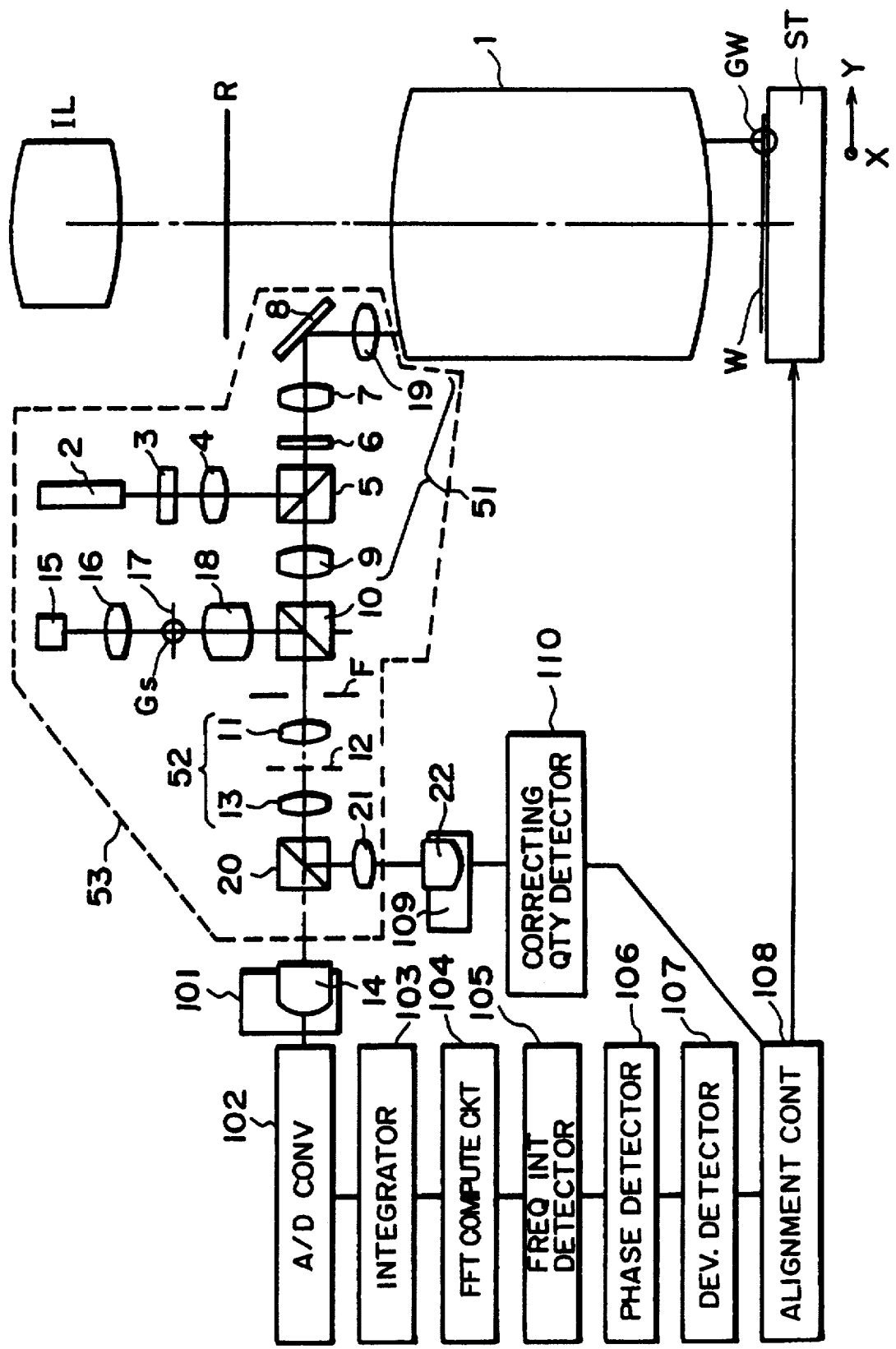
FIG. 14 is a schematic and diagrammatic view of a modified form of the FIG. 12 embodiment.

Further, as shown in FIG. 14, the beam splitter 20 for producing light to be used for correcting the deviation may be disposed between the optical system 52 and the solid image pickup device 14, such that both the light which produces interference fringe and the light for calculation of the positional deviation correcting amount Δe may be selected simultaneously by the stopper 12. On that occasion, since only the light to be monitored impinges on the solid image pickup device 22, for calculation of the correction amount Δe the S/N ratio can be improved significantly.

Figure 15:
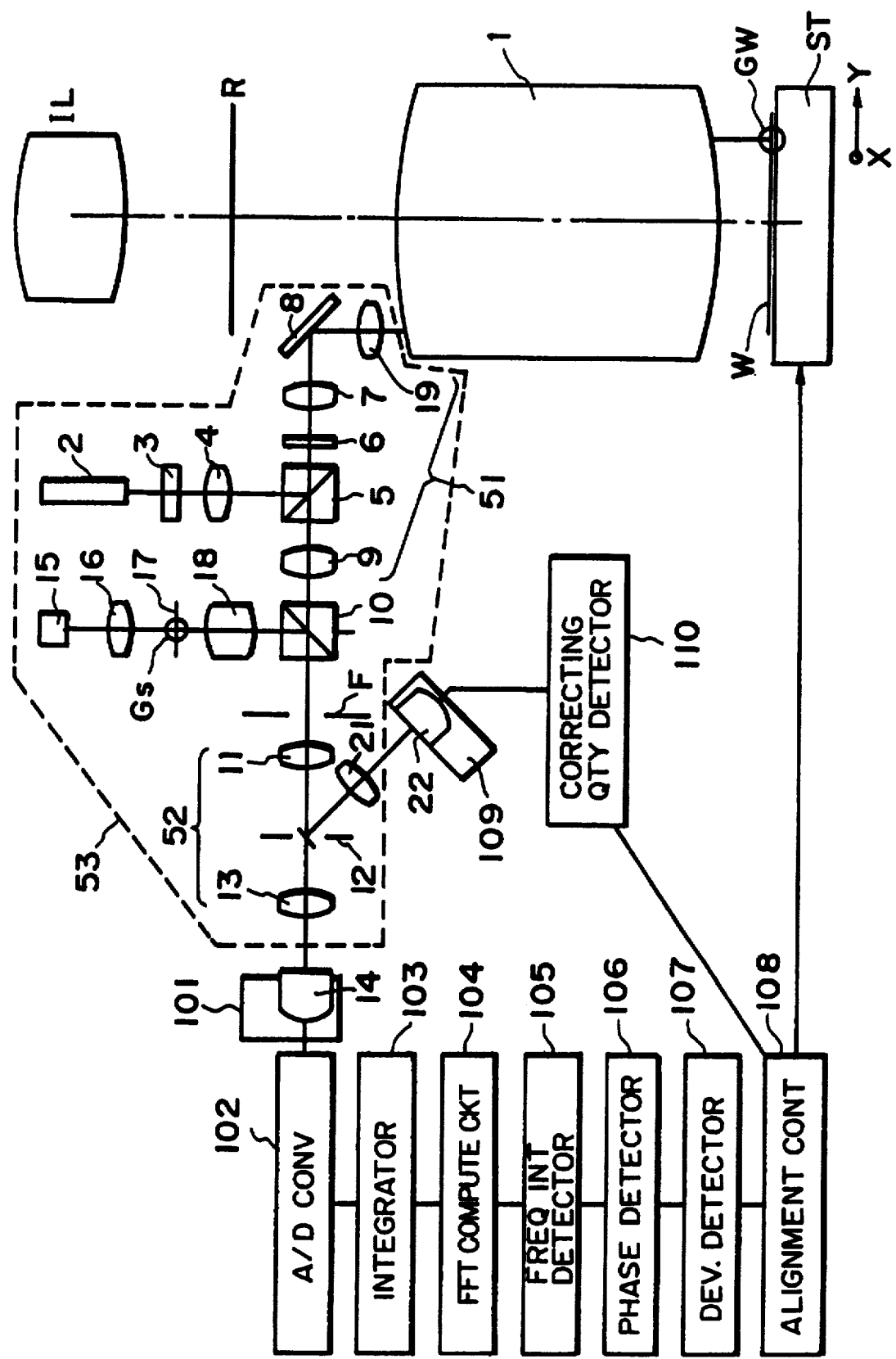
FIG. 15 is a schematic and diagrammatic view of a main portion of a projection exposure apparatus according to a further embodiment of the present invention.

FIG. 15 is a schematic view of a main portion of a projection exposure apparatus according to a sixth embodiment of the present invention.

This embodiment has a feature that the zeroth order light blocking portion of the stopper 12 is provided with a mirror surface having an angle, which serves to reflect the wavelength illuminating the wafer mark GW, the reflected light being directed to an optical system for calculating the positional deviation correcting amount Δe. With this arrangement, the optical system for calculation of the deviation correcting amount Δe can be structured without intervention of a half mirror. Thus, loss of light quantity is avoided and production of stray light is reduced.

Figure 16:
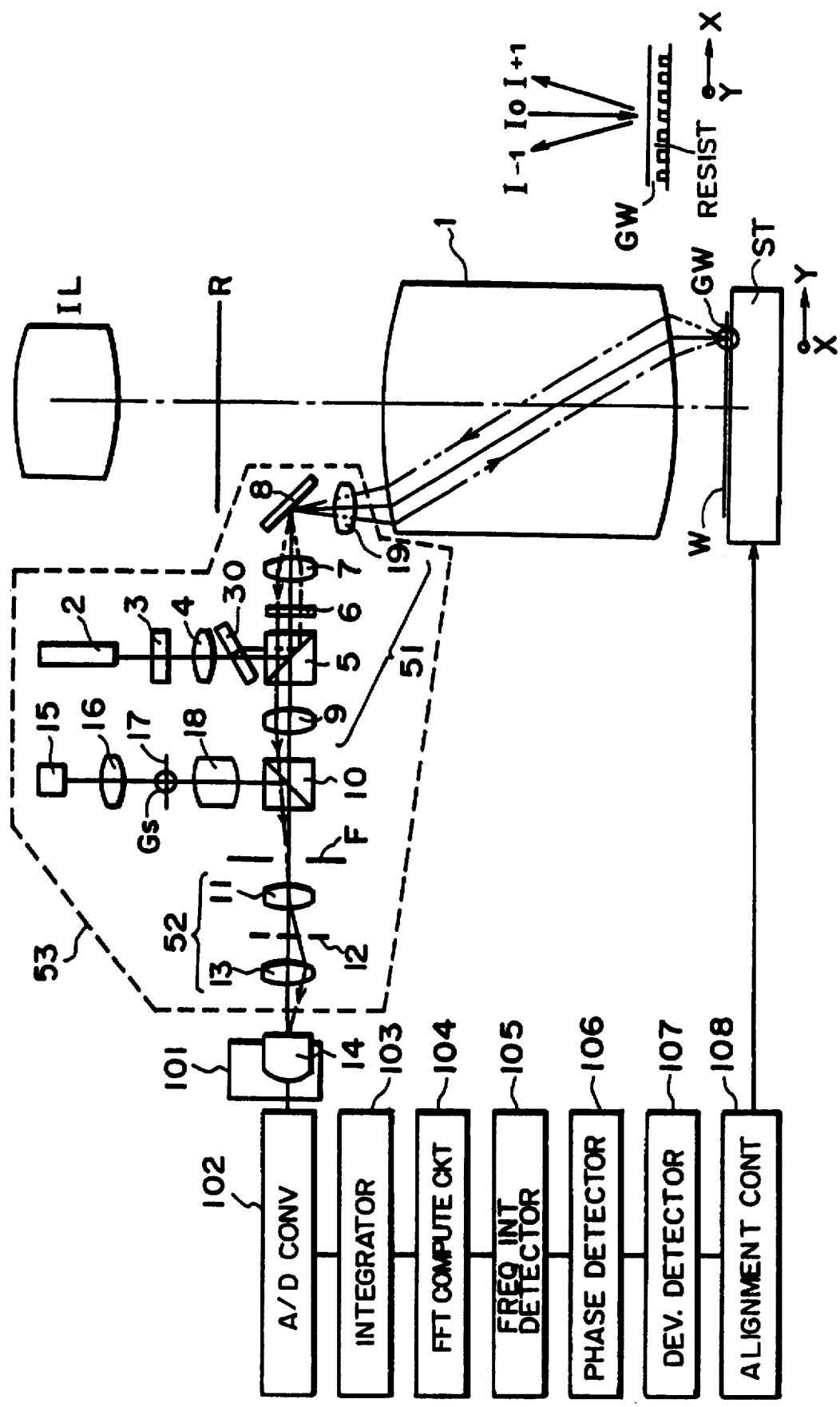
FIG. 16 is a schematic and diagrammatic view of a main portion of a projection exposure apparatus according to a still further embodiment of the present invention.
Figure 22A:
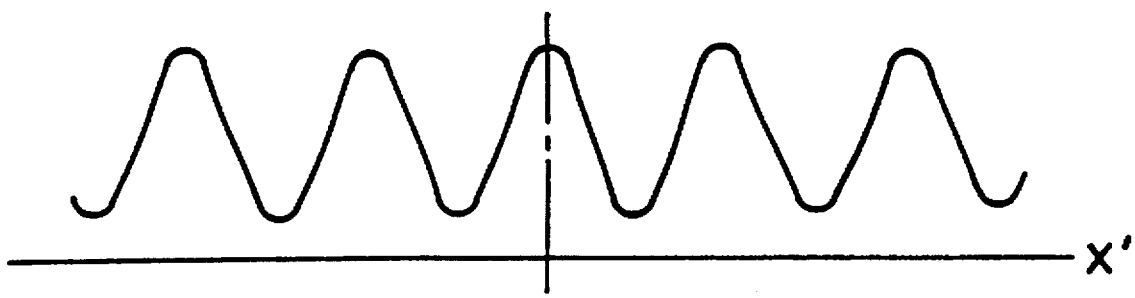
FIGS. 22A–22C are representations for explaining a wafer mark image and a wafer mark sectional shape.
Figure 22B:
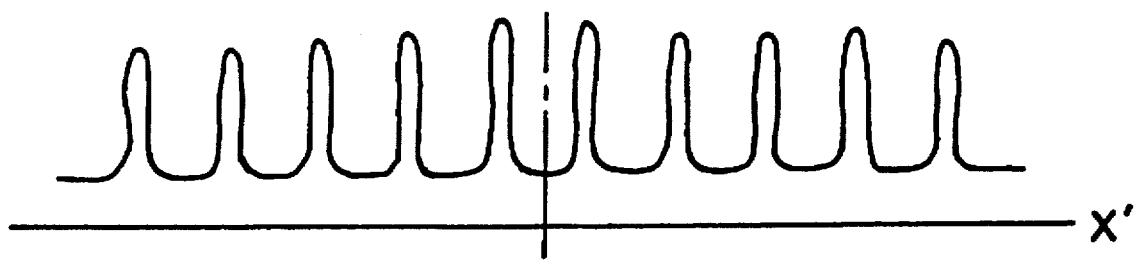
Figure 22C:
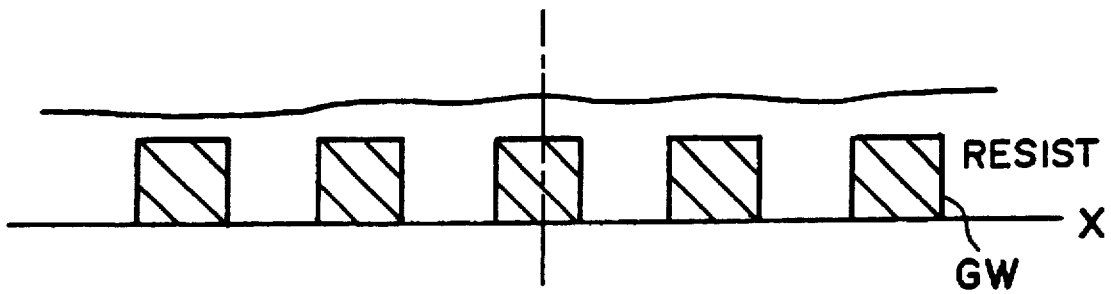

FIG. 16 is a schematic view of a main portion of a projection exposure apparatus according to a seventh embodiment of the present invention. Like numerals as those of FIG. 1 are assigned to corresponding elements.

This embodiment differs from the FIG. 1 embodiment in that light from a laser 1 is projected obliquely onto the grating mark GW of the wafer W, after being deflected by a parallel flat plate 30. The remaining portion is essentially of the same structure as the FIG. 1 embodiment.

Generally, depending on the film thickness of a resist, the reflected light from a grating mark GW of a wafer interfere with the reflection light from the bottom surface, for example. If this occurs, the reflection light from the grating mark GW is reduced which ends in failure of producing a sufficient detection signal.

In consideration of this, in this embodiment the grating mark GW is illuminated along an oblique direction to thereby reduce the interference of light by the resist film. This assures sufficient reflection light, allowing high precision detection of the grating mark GW.

The structural features of this embodiment will now be explained.

Generally, when light is projected perpendicularly onto a wafer mark (grating mark) GW of a wafer W whose surface is coated with a resist of a certain thickness, there occurs interference between reflection lights from the top and bottom surfaces of the resist, leading to failure of detecting the reflective diffraction light from the grating mark GW.

In consideration of this, in this embodiment the parallel flat plate 30 disposed on the pupil plane is inclined (the inclination mechanism is not illustrated), whereby the light can be projected to the grating mark GW at a variable angle $\theta$ such as shown in FIG. 17. This allows changing the interference condition in many ways. Sufficient reflective diffraction light is obtainable by determining the angle by which the intensity of reflective diffraction light from the grating mark GW becomes high.

While in this embodiment the oblique projection is laid within the perpendicular section to the direction of pitch of the grating mark, the projection may be inclined within a parallel section if pitch is corrected in accordance with the incidence angle $\theta$.

If the incident beam is inclined by $\theta$ such as shown in FIG. 18, there arises a path difference $\delta$ which is expressed as follows:

$$\delta = 2nd(1/\cos\theta - 1)$$

where d is the resist film thickness and n is the refractive index of the resist.

Here, within the range $0 \leq \delta \leq \lambda/4$, the intensity of the reflective diffraction light can be changed from minimum to maximum.

For example, if resist film thickness d=1 micron, the refractive index of the resist is n=1.6 and the beam wavelength is $\lambda$=0.6328 micron, then the angle $\theta$ which satisfies $\delta = \lambda/4$ is:

$$\theta = 17.6 \text{ (deg.)}$$

By adjusting the parallel flat plate 30 so that the incidence angle $\theta$ is kept within this range, a proper intensity of reflective diffraction light can be produced.

It is to be noted here that, due to the effect of oblique projection, the alignment signal contains an error if the focus is not set correctly. Thus, the focus may once be detected at the position for the signal detection. This easily allows correction of error. Any deviation ΔZ from a focus reference position can be corrected by applying a correcting amount ΔZtan$\theta$ to the alignment signal (in a case where inclination lies in the detecting direction). Also, if the focus detecting position is fixed and the alignment detecting position is separate therefrom, after completion of the focus detection the stage may be moved to the detecting position while relying on the stage precision.

While in the present invention the image pickup means detects the two-dimensional image signal and, through electric integration in a certain direction, a one-dimensional projection integration signal is produced, it is easily possible to modify the structure so that a cylindrical lens is disposed in front of the image pickup means to execute optical integration with respect to one direction and that a one-dimensional image pickup means is used to produce a one-dimensional projection integration signal.

In accordance with the present invention as described hereinbefore, through appropriate arrangement of the components, an alignment method and a projection exposure apparatus using the same are provided: in which an alignment grating mark of a wafer is illuminated with monochromatic light of a wavelength different from that of exposure light; an interference image based on reflective diffraction light produced thereby is formed on an image pickup means surface; by using an image signal obtainable from the image pickup means, the alignment of a reticle and the wafer can be executed at a high speed and with a high precision, whereby high resolution projection exposure is assured.

Particularly, with the present invention, the position of a grating mark is detected and alignment of the same is executed, by which a high-speed and high-precision alignment method is assured. Also, the reflective diffraction light from the grating mark is limited to ± n-th order diffraction light, and a laser light source of monochromatic light is used as the illumination means. This ensures easy correction of aberration of a detection optical system for the grating mark. Also, the problem of small light quantity or low S/N ratio in a small surface step process can be removed. Thus, the present invention assures a high-precision non-exposure light TTL alignment system in a projection exposure apparatus using an excimer laser as the exposure light.

Further, by appropriately setting the opening NA, to each diffraction light, of a stopper for selectively extracting the reflective diffraction light, transmission of unwanted image-wise information within or around a grating mark of the object to the image pickup means and resultant degradation of the S/N ratio are prevented. Additionally, any oscillating means for reducing the effect of speckle noise becomes unnecessary, and this avoids loss of light quantity. Further, an optical system for correcting aberration of the projection lens can be made very simple, thus assuring stable position measurement of high S/N ratio.

Further, by disposing the reflection surface of a reflection member, for extracting the reflective diffraction light out of the projection lens, in the neighborhood of the position approximately conjugate with the grating mark position, any change with time due to the environmental conditions (such as temperature, pressure or mechanical stability) can be reduced, whereby stable position measurement is assured.

In another aspect, a solid image pickup device is disposed on a pupil plane of a detection optical system which provides a Fourier transformation plane of an image plane corresponding to the wafer surface, and any change in reflection angle of wafer reflected light from the imaging position of the wafer reflected light is detected. Also, the amount and direction of deviation of the detected position of the grating mark due to non-uniformness of resist coating are detected. On the basis of this, the detected position as determined from an interference image formed on the image pickup device disposed on the image plane, is corrected, whereby high-precision alignment without being affected by wafer process conditions such as non-uniformness of resist coating, is assured.

Furthermore, by obliquely projecting light onto a grating mark, the effect of interference due to the resist thickness is reduced and a sufficient detection signal can be produced. Thus, high-precision alignment having a high S/N ratio is assured.

While the invention has been described with reference to the structures disclosed herein, it is not confined to the details set forth and this application is intended to cover such modifications or changes as may come within the purposes of the improvements or the scope of the following claims.

What is claimed is:

1. A position detecting method, comprising steps of:

illuminating a grating mark of an object with monochromatic light;

forming an interference image on image pickup means by using ±n-th order light (n=1, 2, 3. . . ) among reflective diffraction light from the grating mark;

integrating an image signal produced by the image pickup means, within a two-dimensional window of a predetermined size set with respect to the image signal and along one direction in two-dimensional coordinates, to produce a one-dimensional projection integration signal;

transforming, through rectangular transformation, the one-dimensional projection integration signal into a spatial frequency region;

selecting, on the spatial frequency region and from the one-dimensional projection integration signal, a spatial frequency component which appears in the interference image due to periodicity of the grating mark;

detecting the position of the grating mark in accordance with a spatial frequency component selected in said selecting step;

detecting a peak of a frequency intensity distribution in a neighborhood of the spatial frequency component peculiar to the periodicity of the grating mark; and executing weighted averaging by using phase and intensity of frequency components in a neighborhood of the peak, to thereby detect the position of the grating mark.

2. A projection exposure apparatus for projecting through a projection lens a pattern of a reticle illuminated with exposure light onto a wafer, the projection lens being aberration corrected with respect to the exposure light, said apparatus comprising:

an illumination source for illuminating through the projection lens a grating mark of the wafer with monochromatic light, the monochromatic light having a wavelength different from a wavelength of the exposure light;

a reflection member for directing reflective diffraction light from the grating mark and passed through the projection lens, outwardly of a path of exposure light;

a stopper for selectively extracting ±n-th order diffraction light (n=1, 2, 3 . . . ) of the reflective diffraction light;

optical means for forming an interference image by using the extracted n-th order light, said optical means comprising a correction optical system for correcting aberration produced when the grating mark of the wafer illuminated with the monochromatic light is projected on a predetermined plane by the projection lens;

image pickup means for image-taking the interference image; and detecting means for integrating an image signal produced by the image pickup means, within a two-dimensional window of a predetermined size set with respect to the image signal and along one direction in two-dimensional coordinates, whereby a one-dimensional projection integration signal is produced, said detecting means transforming, through rectangular transformation, the one-dimensional projection integration signal into a spatial frequency region and selecting, on the spatial frequency region and from the one-dimensional projection integration signal, a spatial frequency component which appears in the interference image due to periodicity of the grating mark, said detecting means detecting a position of the grating mark in accordance with a selected spatial frequency component.

3. A projection exposure apparatus for projecting through a projection lens a pattern of a reticle illuminated with exposure light onto a wafer, said apparatus comprising:

an illumination source for illuminating through the projection lens a grating mark of the wafer with monochromatic light;

a reflection member for directing reflective diffraction light from the grating mark and passed through the projection lens, outwardly of a path of exposure light;

a stopper for selectively extracting ±n-th order diffraction light (n=1, 2, 3 . . . ) of the reflective diffraction light;

optical means for forming an interference image by using the extracted n-th order light;

image pickup means for image-taking the interference image; and detecting means for integrating an image signal produced by the image pickup means, within a two-dimensional window of a predetermined size set with respect to the image signal and along one direction in two-dimensional coordinates, whereby a one-dimensional projection integration signal is produced, said detecting means transforming, through rectangular transformation, the one-dimensional projection integration signal into a spatial frequency region and selecting, on the spatial frequency region and from the one-dimensional projection integration signal, a spatial frequency component which appears in the interference image due to periodicity of the grating mark, said detecting means (i) detecting a position of the grating mark in accordance with a selected spatial frequency component, (ii) detecting a peak of a frequency intensity distribution in a neighborhood of the spatial frequency peculiar to the periodicity of the grating pattern, and (iii) executing weighted averaging by using phase and intensity of frequency components in a neighborhood of the peak, to thereby detect the position of the grating mark.

4. A projection exposure apparatus for projecting through a projection lens a pattern of a reticle illuminated with exposure light onto a wafer, said apparatus comprising:

an illumination source for illuminating through the projection lens a grating mark of the wafer with monochromatic light;

a reflection member for directing reflective diffraction light from the grating mark and passed through the projection lens, outwardly of a path of exposure light;

a stopper for selectively extracting ±n-th order diffraction light (n=1, 2, 3 ...) of the reflective diffraction light;

optical means for forming an interference image by using the extracted n-th order light;

image pickup means for image-taking the interference image; and detecting means for integrating an image signal produced by the image pickup means, within a two-dimensional window of a predetermined size set with respect to the image signal and along one direction in two-dimensional coordinates, whereby a one-dimensional projection integration signal is produced, said detecting means transforming, through rectangular transformation, the one-dimensional projection integration signal into a spatial frequency region and selecting, on the spatial frequency region and from the one-dimensional projection integration signal, a spatial frequency component which appears in the interference image due to periodicity of the grating mark, said detecting means (i) detecting a position of the grating mark in accordance with a selected spatial frequency component, (ii) detecting a peak of a frequency intensity distribution in a neighborhood of the spatial frequency peculiar to the periodicity of the grating pattern, and (iii) correcting projection magnification to the grating mark.

5. A projection exposure apparatus for projecting through a projection lens a pattern of a reticle illuminated with exposure light onto a wafer, said apparatus comprising:

an illumination source for illuminating through the projection lens a grating mark of the wafer with monochromatic light;

a reflection member for directing reflective diffraction light from the grating mark and passed through the projection lens, outwardly of a path of exposure light;

a stopper for selectively extracting ±n-th order diffraction light (n=1, 2, 3 ...) of the reflective diffraction light;

image pickup means for image-taking an interference image formed with the extracted n-th order light;

wherein said stopper has an opening NA facing the wafer side to reflective diffraction light which satisfies a relationship 0<NA<T·β·λ/2, where λ is the wavelength of the monochromatic light from said illumination source, β is the absolute value of a projection magnification of the grating mark onto the image pickup means and T is a spatial frequency of the interference image formed on the image pickup means; and detecting means for integrating an image signal produced by the image pickup means, within a two-dimensional window of a predetermined size set with respect to the image signal and along one direction in two-dimensional coordinates, whereby a one-dimensional projection integration signal is produced, said detecting means transforming, through rectangular transformation, the one-dimensional projection integration signal into a spatial frequency region and selecting, on the spatial frequency region and from the one-dimensional projection integration signal, a spatial frequency component which appears in the interference image due to periodicity of the grating mark, said detecting means detecting a position of the grating mark in accordance with a selected spatial frequency component.

6. An apparatus according to claim 5, wherein the projection lens is aberration corrected with respect to the exposure light, wherein the monochromatic light from said illumination source has a wavelength different from a wavelength of the exposure light, and wherein said optical means includes a correction optical system for correcting aberration to be produced when the grating mark of the wafer illuminated with the monochromatic light is projected on a predetermined plane by the projection lens.

7. A position detecting method, comprising steps of:

illuminating a grating mark of an object with monochromatic light;

forming an interference image on image pickup means by using ±n-th order light (n=1, 2, 3 ...) among reflective diffraction light from the grating mark;

integrating an image signal produced by the image pickup means, within a two dimensional window of a predetermined size set with respect to the image signal and along one direction in two-dimensional coordinates, to produce a one-dimensional projection integration signal;

transforming, through rectangular transformation, the one-dimensional projection integration signal into a spatial frequency region;

selecting, on the spatial frequency region and from the one-dimensional projection integration signal, a spatial frequency component which appears in the interference image due to periodicity of the grating mark; and detecting the position of the grating mark in accordance with a selected spatial frequency component, detecting a reflection angle of the reflected light from the object and, in accordance with a detected reflection angle, correcting a detected position of the grating mark.

8. A projection exposure apparatus for projecting through a projection lens a pattern of a reticle illuminated with exposure light onto a wafer, said apparatus comprising:

an illumination source for illuminating through the projection lens a grating mark of the wafer with monochromatic light;

a reflection member for directing reflective diffraction light from the grating mark and passed through the projection lens, outwardly of a path of exposure light;

a stopper for selectively extracting ±n-th order diffraction light (n=1, 2. 3 ...) of the reflective diffraction light;

optical means for forming an interference image by using the extracted n-th order light;

image pickup means for image-taking the interference image; and detecting means for integrating an image signal produced by the image pickup means, within a two-dimensional window of a predetermined size set with respect to the image signal and along one direction in two-dimensional coordinates, whereby a one-dimensional projection integration signal is produced, said detecting means transforming, through rectangular transformation, the one-dimensional projection integration signal into a spatial frequency region and selecting, on the spatial frequency region and from the one-dimensional projection integration signal, a spatial frequency component which appears in the interference image due to periodicity of the grating mark, said detecting means detecting the position of the grating mark in accordance with a selected spatial frequency component, and said detecting means detecting a reflection angle of the reflected light from the wafer and correcting a detected position of the grating mark in accordance with a detected reflection angle.

* * * * *

UNITED STATES PATENT AND TRADEMARK OFFICE
CERTIFICATE OF CORRECTION

PATENT NO. : 5,594,549
DATED : January 14, 1997
INVENTOR(S) : Tetsuya MORI, et al.

It is certified that error appears in the above-indentified patent and that said Letters Patent is hereby corrected as shown below:

ON THE COVER PAGE

Under item [56], "References Cited"

FOREIGN PATENT DOCUMENTS:

"03282715   12/1991   Japan"
should read
--3-282715   12/1991   Japan--.

COLUMN 10:

Line 12, "(n=2r)" should read --(N=2r)--.

UNITED STATES PATENT AND TRADEMARK OFFICE
CERTIFICATE OF CORRECTION

PATENT NO. : 5,594,549
DATED : January 14, 1997
INVENTOR(S) : Tetsuya MORI, et al.

It is certified that error appears in the above-indentified patent and that said Letters Patent is hereby corrected as shown below:

<u>COLUMN 16</u>:

Line 5, "the" should read --The--.

Signed and Sealed this

Eighth Day of July, 1997

Attest:

BRUCE LEHMAN

Attesting Officer

Commissioner of Patents and Trademarks